(12) United States Patent
Glenn et al.

(10) Patent No.: US 6,399,418 B1
(45) Date of Patent: Jun. 4, 2002

(54) METHOD FOR FORMING A REDUCED THICKNESS PACKAGED ELECTRONIC DEVICE

(75) Inventors: Thomas P. Glenn, Gilbert, AZ (US); Steven Webster, Muntinlupa (PH); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/916,719

(22) Filed: Jul. 26, 2001

(51) Int. Cl.[7] .................... H01L 21/44; H01L 21/48; H01L 21/50

(52) U.S. Cl. ........................... 438/106; 438/126

(58) Field of Search ................... 438/106, 108, 438/110, 112, 113, 124, 126, 127

(56) References Cited

U.S. PATENT DOCUMENTS

| | | | |
|---|---|---|---|
| 5,096,851 A | * 3/1992 | Yamazaki et al. | 438/127 |
| 5,821,532 A | 10/1998 | Beaman et al. | 250/239 |
| 6,338,985 B1 | * 1/2002 | Greenwood | 438/126 |

* cited by examiner

*Primary Examiner*—David Nelms
*Assistant Examiner*—Phuc T. Dang
(74) *Attorney, Agent, or Firm*—Gunnison, McKay & Hodgson, L.L.P.; Philip J. McKay

(57) ABSTRACT

An electronic device, such as a sensor die, is packaged by first forming a hole through a substrate. The hole is made large enough to position the entire electronic device within the hole. A tape is then applied to the second surface of the substrate to cover a second side of the hole, thereby creating a tape surface at the bottom of the hole. The electronic device is then positioned within the hole such that the electronic device is in contact with, and adhered to, the tape surface at the bottom of the hole. Electronic connections are made between the electronic device and the substrate and a layer of encapsulant is applied.

In one embodiment, the electronic device is a sensor die and an optical element is positioned over an active region of the sensor die before the encapsulant is applied. The encapsulant then surrounds and holds the optical element in position over the active region of the sensor die.

26 Claims, 12 Drawing Sheets

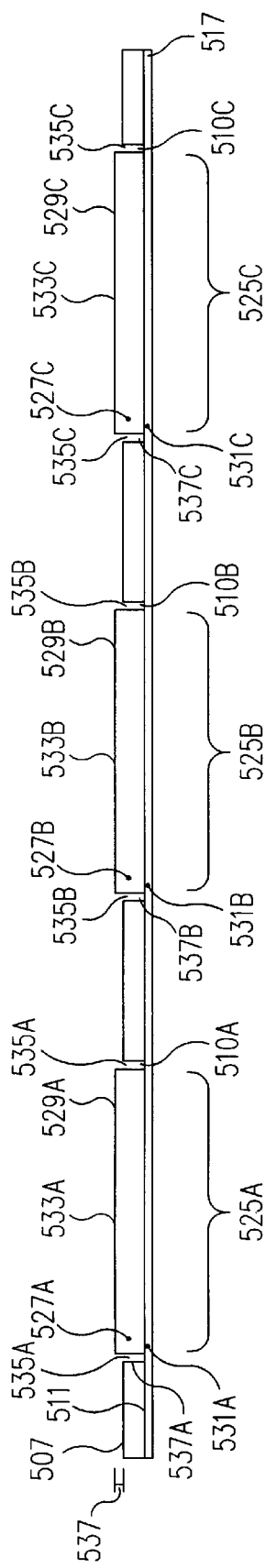
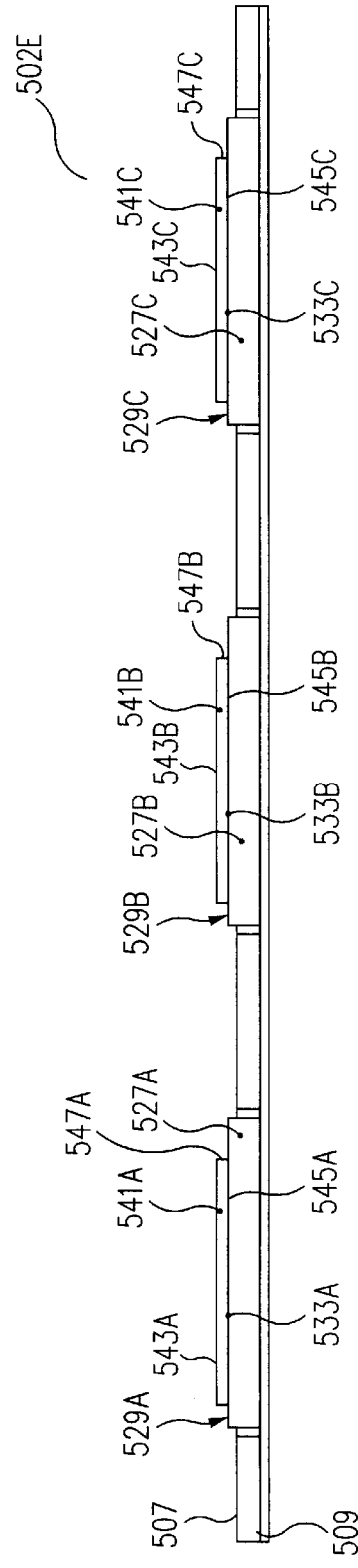
FIG. 5D
FIG. 5E

METHOD FOR FORMING A REDUCED THICKNESS PACKAGED ELECTRONIC DEVICE

FIELD OF THE INVENTION

The present invention relates generally methods of packaging electronic components. More particularly, the present invention relates to a method of forming packaged electronic components with reduced thickness.

BACKGROUND OF THE INVENTION

Virtually every business in the world has become dependent, directly or indirectly, on electronic components such as integrated circuits. In addition, electronic components have permeated our personal lives through their use in systems that control or contribute to almost every aspect of our day from coffee making to network computing. This application of electronic components to what were once seemingly unrelated fields has created a huge demand for these components in increasingly diverse industries and locations. Consequently, there has been a corresponding increase in demand for better methods and structures to package electronic components and for smaller packaged electronic components. This demand has made electronic component packaging one of the most critical and competitive markets in the electronics industry.

To stay competitive, those of skill in the art of electronic component packaging are constantly seeking better ways to provide protection of the extremely fragile electronic components from environmental elements and contamination while, at the same time, providing a solution that does not significantly increase the size or the cost of the finished, packaged electronic component.

FIG. 1 is an enlarged cross-sectional view of an exemplary prior art packaged electronic component 10. As shown in FIG. 1, a first surface 32 of an electronic component such as an integrated circuit (IC) chip 30 was typically mounted to a first surface 18 of prior art substrate 13 by a layer of adhesive 31 so that IC chip 30 was positioned above prior art substrate 13. IC chip 30 was typically mounted to prior art substrate 13 in a location central to metallizations 22. Also shown are bonding pads 38 that were located on a second surface 36 of IC chip 30. Bonding pads 38 were typically electrically connected to corresponding contacts 23 by bond wires 40, made of gold or aluminum for example, using conventional wire bonding techniques. Contacts 23 were connected to metallizations 22. Electrically conductive vias 14 electrically coupled metallizations 22 on first surface 18 of prior art substrate 13 to metallizations 26 on second surface 20 of prior art substrate 13.

Also shown in FIG. 1, is layer of encapsulant 42 that was applied over the entire assembly. In particular, layer of encapsulant 42 covered IC chip 30 including bonding pads 38, bond wires 40, contacts 23, metallizations 22 and the remaining exposed first surface 18 of prior art substrate 13.

As also shown in FIG. 1, interconnection balls 28, typically eutectic solder balls, were attached to contacts 27 using conventional techniques. Contacts 27 were, in turn coupled to metallizations 26 on second surface 20 of prior art substrate 13. Interconnection balls 28 were often arranged in an array thus forming a ball grid array.

As can be seen in FIG. 1, the resulting prior art packed electronic device 10 had a thickness 60 extending from top surface 48 of encapsulant 42 to bottom surface 39 of prior art substrate 13. In prior art packaged electronic devices, such as prior art packaged electronic device 10, the value for thickness 60 was relatively large and typically on the order of 1.1 to 2.0 millimeters. This was highly disadvantageous because the relatively large thickness 60 meant larger and thicker systems. In a market that increasingly stresses small size and portability, this situation was far from ideal.

One major reason that prior art packaged electronic device 10 had a relatively large thickness 60 was the additional thickness 70 that prior art substrate 13 added to prior art packaged electronic device 10. Prior art substrate 13 was necessary to allow electrical connections to be made between IC chip 30 and off chip locations by way of contacts 23, metallizations 22, electrically conductive vias 14, metallizations 26, and contacts 27, as discussed above. Thickness 70 was added to prior art packaged electronic device 10 because, in the prior art, IC chip 30 was mounted on top of prior art substrate 13, to first surface 18 of prior art substrate 13. Consequently both the thickness of IC chip 30 and the thickness 70 of prior art substrate contributed to the thickness 60 prior art packaged electronic device 10. This added thickness was considered a necessary evil in the prior art because it was thought that the IC chip 30 needed to be mounted on top of prior art substrate 13 to provide a strong and stable structure during die electrical connection and to stabilize IC chip 30 within the structure of prior art packaged electronic device 10.

In addition to being relatively thick and cumbersome, prior art packages, such as that shown in FIG. 1, were particularly ill suited for newer electronic devices such as image sensor die and other optical devices, which not only require small size, i.e., minimal thickness, but also require mounting of optical elements such as glass plates or lenses. Image sensors and assemblies are well known to those of skill in the art. Image sensors typically include an active area, which is responsive to electromagnetic radiation. In prior art image sensor assemblies, an image sensor was located within a housing that supported a window. Radiation passed through the window and struck the active area of the image sensor, which responded to the radiation. For the image sensor to function properly, the image sensor had to be positionally aligned with the window to within tight tolerances.

Since prior art packages, such as shown in FIG. 1, were not well suited to packaging image sensor dice, in the prior art, an image sensor assembly was formed by mounting the image sensor directly to a printed circuit motherboard. After the image sensor was mounted, a housing was mounted around the image sensor and to the printed circuit motherboard. This housing provided a seal around the image sensor, while at the same time, supported a window above the image sensor.

Beaman et al., U.S. Pat. No. 5,821,532, hereinafter Beaman, which is herein incorporated by reference in its entirety, is one example of a prior art image sensor assembly. Beaman sets forth a printed circuit board that included a pair of apertures used as alignment features for mounting the image sensor and for mounting the optics that included the window. More particularly, the pair of apertures were used as the mounting reference for the image sensor and then were used as the mounting reference for the optics.

As discussed in Beaman, prior art image sensor assemblies used a housing to support the window and to hermetically seal the image sensor (see housing 24 and window 25 of Beaman FIG. 4 for example). This housing was typically formed of ceramic that advantageously had excellent resistance to moisture transmission to protect the image sensor from the ambient environment. In addition, ceramic housings provided the strength and stability thought necessary in the prior art. However, ceramic is relatively expensive and heavy compared to other packaging materials and, in the current market, it is critical to form the image sensor assembly at minimal cost. In addition, and perhaps even more disadvantageous, was the fact that prior art image sensor assemblies were very large and bulky and further added to the thickness and overall size of subsystems employing these prior art image sensor assemblies.

In addition, mounting the housing at the printed circuit board level, as was done in the prior art, was inherently labor intensive and made repair or replacement of the image sensor difficult. In particular, removal of the housing exposed the image sensor to the ambient environment. Since the image sensor was sensitive to dust, as well as other environmental factors, mounting the housing at the printed circuit board level made it mandatory to make repairs, or to replace, the image sensor in a controlled environment such as a clean room, otherwise there was a risk of damaging or destroying the image sensor. Thus, using the prior art method of mounting the housing at the printed circuit board level often meant transporting the entire motherboard into the clean room.

What is needed is a method for packaging an electronic device, which results in a thinner packaged device and can be used to package image sensor devices.

SUMMARY OF THE INVENTION

In accordance with the present invention, an electronic device is packaged by first forming a hole through a substrate, from a fist surface of the substrate to a second surface of the substrate. According to the invention, the hole is made large enough to position the entire electronic device within the hole. A tape is then applied to the second surface of the substrate to cover a second side of the hole, thereby creating a tape surface at the bottom of the hole. The electronic device is then positioned within the hole such that a second surface of the electronic device is in contact with, and adhered to, the tape surface at the bottom of the hole. Consequently, using the method of the invention, the tape provides the stability for the electronic device, such as an IC, during die attachment, but the tape, unlike prior art structures, does not add significantly to the thickness of the package.

Once the electronic device is positioned at the bottom of the hole and adhered to the tape surface at the bottom of the hole, electronic connections are made between the electronic device and the substrate using known methods such as bond wires. With the electronic connections made, a layer of encapsulant is applied to a first surface of the electronic device, a first surface of the substrate, the electronic connections, e.g., the bond wires, and to fill in any gaps between the electronic device and the sides of the hole. Consequently, using the method of the invention, the encapsulant provides the stability for the packaged electronic device however, unlike prior art structures, the encapsulant does not add significantly to the thickness of the package.

The method of the present invention is particularly well suited to packaging sensor devices such as sensor dice. In this embodiment, a glass plate or lens is placed over the active surface of the sensor die to cover a first region of the first surface of the sensor die, before the encapsulant is applied. Then, the encapsulant is applied to: the first surface of the substrate; the portion of the first surface of the sensor die not covered by the optical element; the electronic connections, e.g., the bond wires; and to fill in any gaps between the sensor die and the sides of the hole. In this embodiment of the invention, the encapsulant does not cover a first surface of the optical element, however, the encapsulant covers the sides of the optical element and serves to surround and hold the optical element in place over the active region of the sensor die.

In one embodiment of the invention, several electronic devices are packaged at once by providing a large, multi-package substrate and forming a matrix of multiple holes in the multi-package substrate. The multiple holes are cut through the multi-package substrate, from a fist surface of the multi-package substrate to a second surface of the multi-package substrate. According to the invention, the holes are made large enough to position an entire electronic device within each hole. A tape is then applied to the second surface of the multi-package substrate to cover a second side of each hole, thereby creating a tape surface at the bottom of each hole. Electronic devices are then positioned, one electronic device within a corresponding hole such that a second surface of each electronic device is in contact with, and adhered to, the tape surface at the bottom of its corresponding hole.

Once the electronic devices are positioned at the bottom of their corresponding holes and adhered to the tape surface at the bottom of their corresponding holes, electronic connections are made between the electronic devices and the multi-package substrate using known methods such as bond wires. With the electronic connections made, a layer of encapsulant is applied to a first surface of the electronic devices, a first surface of the multi-package substrate, the electronic connections, e.g., the bond wires, and to fill in any gaps between the electronic devices and the sides of their corresponding holes. The encapsulant is then dried or cured and the individual electronic devices are then singulated by methods well known to those of skill in the art.

The method of the present invention is particularly well suited to packaging multiple sensor devices such as sensor dice. In this embodiment, the electronic devices are sensor dice and a glass plate or lens is placed over the active surface of each sensor die to cover a first region of the first surface of each sensor die, before the encapsulant is applied. Then, the encapsulant is applied to: the first surface of the multi-package substrate; the portions of the first surface of the sensor dice not covered by the optical elements; the electronic connections, e.g., the bond wires; and to fill in any gaps between the sensor dice and the sides of their corresponding holes. In this embodiment of the invention, the encapsulant does not cover a first surface of the optical elements, however, the encapsulant covers the sides of the optical elements and serves to surround and hold the optical elements in place over the active regions of the sensor dice. The encapsulant is then dried or cured and the individual packaged sensor dice are then singulated using methods well known to those of skill in the art.

Using the method of the invention, packaged electronic devices are provided which are thinner, require less materials, are less expensive, and can be manufactured using industry standard materials and equipment. In particular, according to the invention, the electronic device is situated within the substrate. Therefore, in contrast to the prior art, the packaged electronic devices made according to the method the invention are thinner because the thickness of the substrate is not added to the thickness of the electronic device.

In addition, according to the invention, the electronic device is held in position by the tape surface at the bottom of the hole and then by the encapsulant surrounding, and covering, at least a portion, of the electronic device. Consequently, and in contrast to the prior art, the packaged electronic devices of the invention do not require expensive adhesives, the labor, or step, to apply these adhesives or the added thickness of these adhesives.

In addition, when the method of the invention is used to package sensor devices, such as sensor die, the package is not only thinner and protected from the elements, but the optical element is held in position by the adhesive. Consequently, and in contrast to the prior art, there is no need for a sensor housing mounted around the sensor die and to the printed circuit motherboard. Therefore, using the invention, the sensor dice can be packaged more cheaply than prior art devices and, in contrast to prior art systems, the senor dice can be serviced and replaced in the field. The resulting packaged sensor die is also smaller, thinner, lighter, and less expensive to produce than prior art sensor die systems.

These and other features and advantages of the present invention will be more readily apparent from the detailed description set forth below taken in conjunction with the accompanying drawings.

BRIEF DESCRIPTION OF THE DRAWINGS

FIG. 5D shows a multi-package substrate with sensor dice positioned, one each, in corresponding holes according to the principles of the invention;

FIG. 5E shows a multi-sensor package structure that is identical to the structure of FIG. 5D but also includes optical elements according to one embodiment of the invention;

In the following description, the same or similar elements are labeled with the same or similar reference numbers.

DETAILED DESCRIPTION

Figure 1:
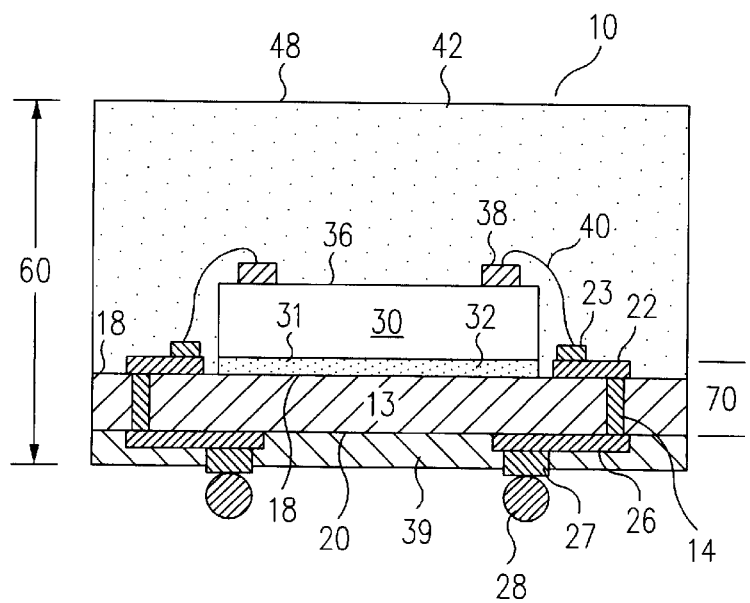
FIG. 1 is an enlarged cross-sectional view of an exemplary prior art packed electronic device.

In accordance with the present invention, an electronic device is packaged by first forming a hole (210 in FIG. 2) through a substrate (200), from a fist surface (207) of the substrate to a second surface (209) of the substrate. According to the invention, the hole is made large enough to position the entire electronic device (320 in FIG. 3C) within the hole. A tape (300) is then applied to the second surface of the substrate to cover a second side of the hole, thereby creating a tape surface (305) at the bottom of the hole. The electronic device is then positioned within the hole such that a second surface (324) of the electronic device is in contact with, and adhered to, the tape surface at the bottom of the hole.

Figure 3A:
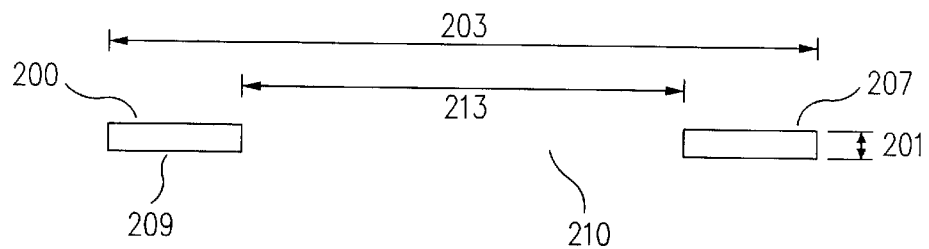
FIG. 3A shows an enlarged view of a substrate according to the principles of the invention, as it would be seen along line 3A—3A in FIG. 2.
Figure 3B:
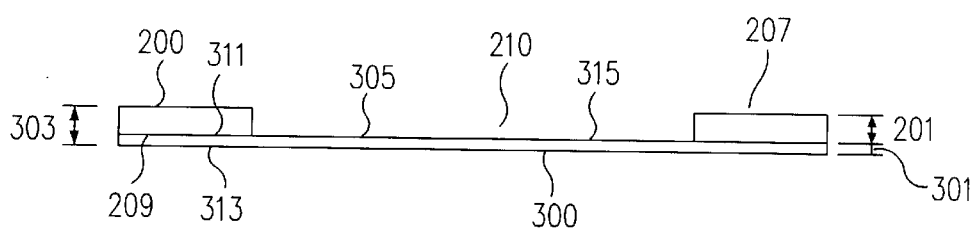
FIG. 3B shows a substrate including tape that, according to the invention, is applied to the substrate second surface.
Figure 3C:
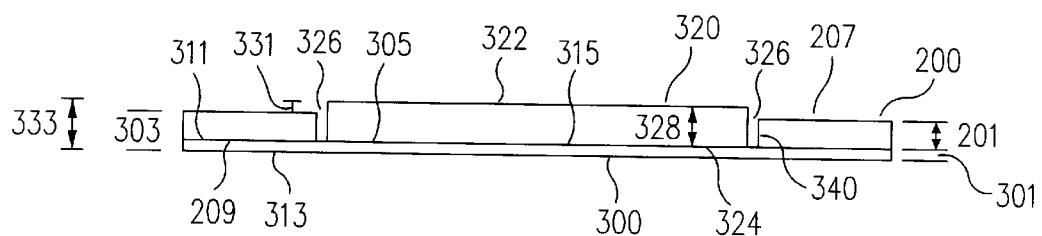
FIG. 3C shows a substrate including tape attached to a surface of the substrate and an electronic device positioned in a hole in the substrate on a portion of the first surface of the tape at the bottom of the hole.
Figure 3D:
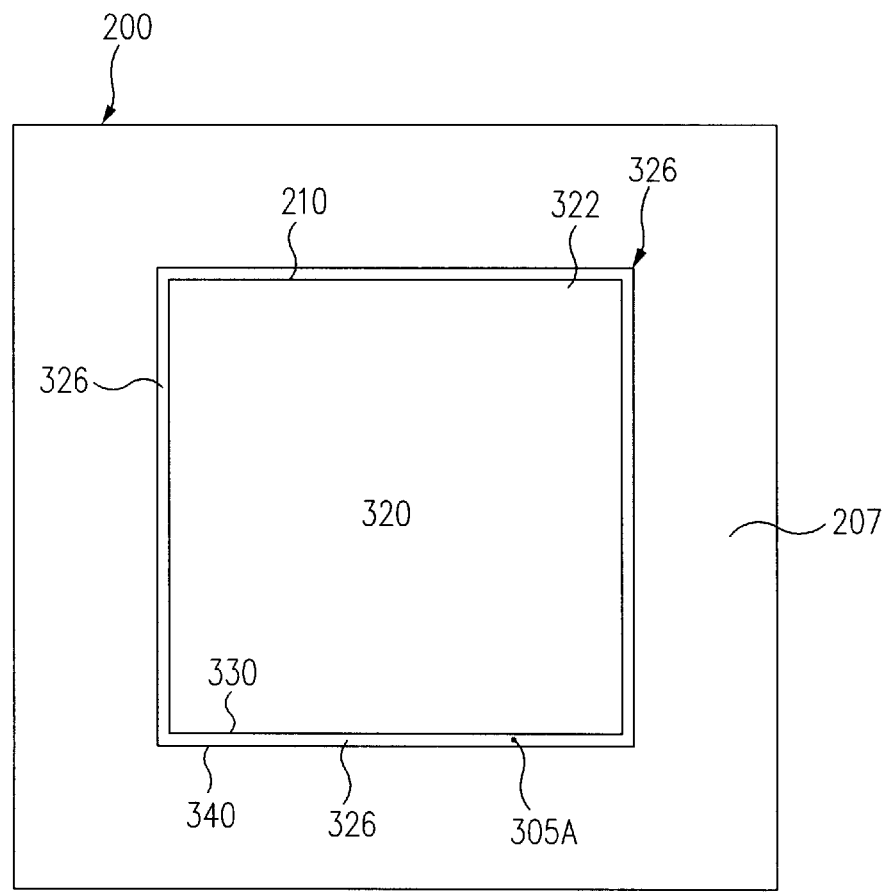
FIG. 3D is an enlarged overhead view of the structure of FIG. 3C including a substrate with substrate first surface and an electronic device with electronic device first surface according to the principles of the invention.
Figure 3E:
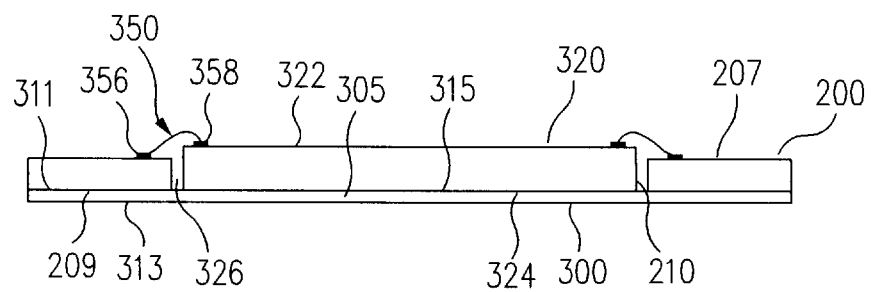
FIG. 3E shows the structure of FIG. 3D further including an electronic device electrically coupled to the substrate using bond wires according to the principles of one embodiment of the invention.

Once the electronic device is positioned at the bottom of the hole and adhered to the tape surface at the bottom of the hole, electronic connections are made between the electronic device and the substrate using known methods such as wire bonding (FIG. 3E). With the electronic connections made, a layer of encapsulant (370 in FIG. 3F) is applied to a first surface of the electronic device (322), a first surface of the substrate, the electronic connections, e.g., the bond wires, and to fill in any gaps (326) between the electronic device and the sides (340) of the hole.

Figure 4A:
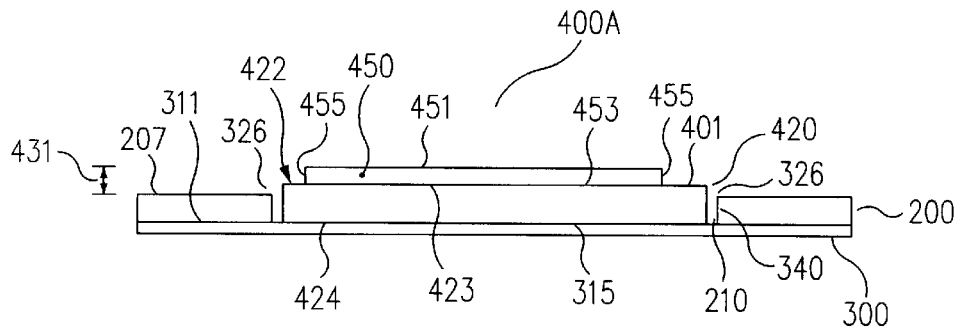
FIG. 4A shows one embodiment of sensor package structure including an optical element in accordance with the principles of the present invention.

The structure of the present invention is particularly well suited to packaging sensor devices such as sensor dice (420 in FIG. 4A). In this embodiment, an optical element (450), such as a glass plate or lens, is placed over the active surface (423) of the sensor die to cover a first region of the first surface of the sensor die, before the encapsulant (470 in FIG. 4D) is applied. Then, the encapsulant is applied to: the first surface of the substrate; the portion of the first surface of the sensor die not covered by the optical element; the electronic connections, e.g., the bond wires; and to fill in any gaps between the sensor die and the sides of the hole. In this embodiment of the invention, the encapsulant does not cover a first surface (451) of the optical element, however, the encapsulant covers the sides (455) of the optical element and serves to surround and hold the optical element in place over the active region of the sensor die.

Figure 5A:
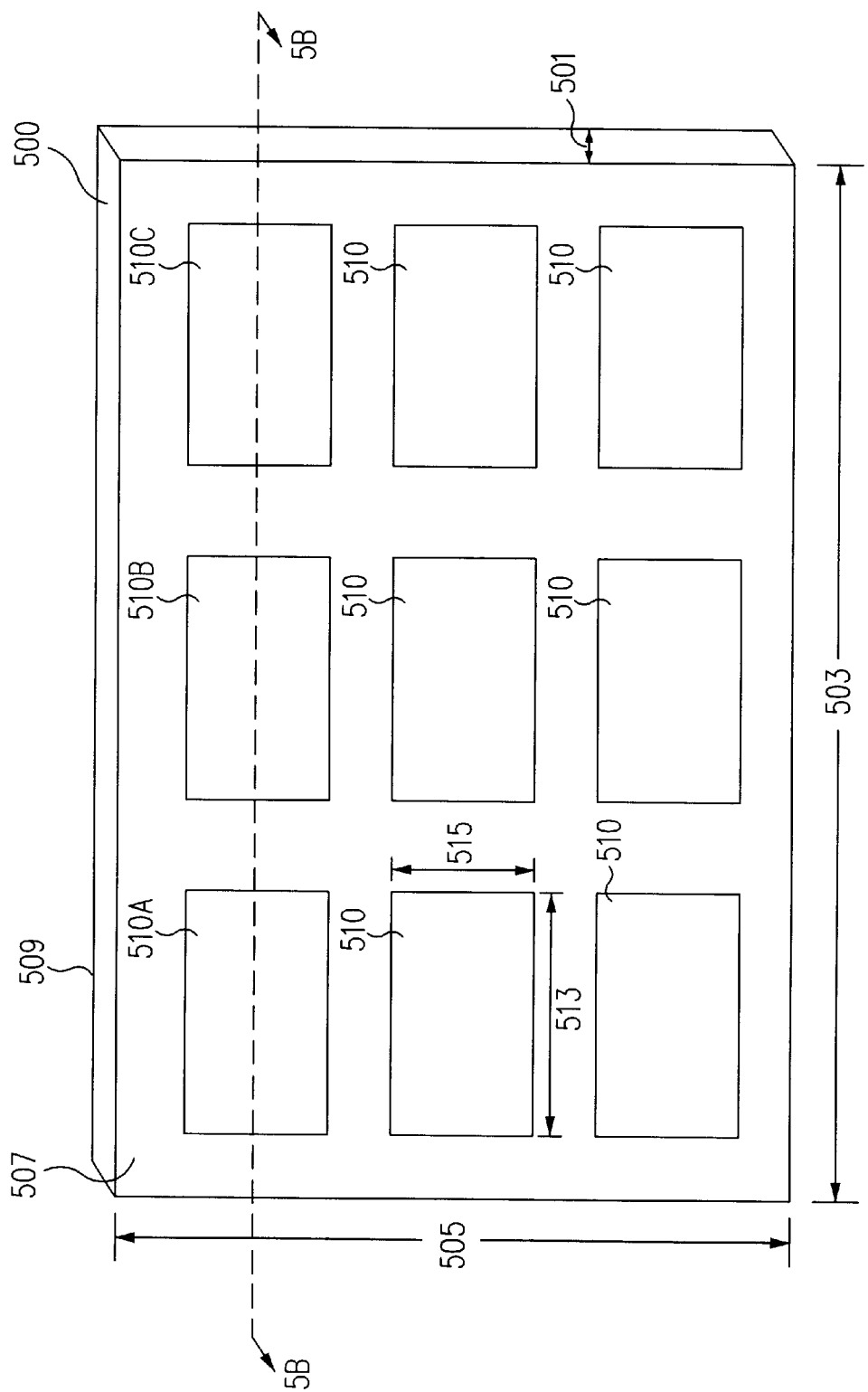
FIG. 5A shows a multi-package substrate in accordance with one embodiment of the invention.
Figure 5B:
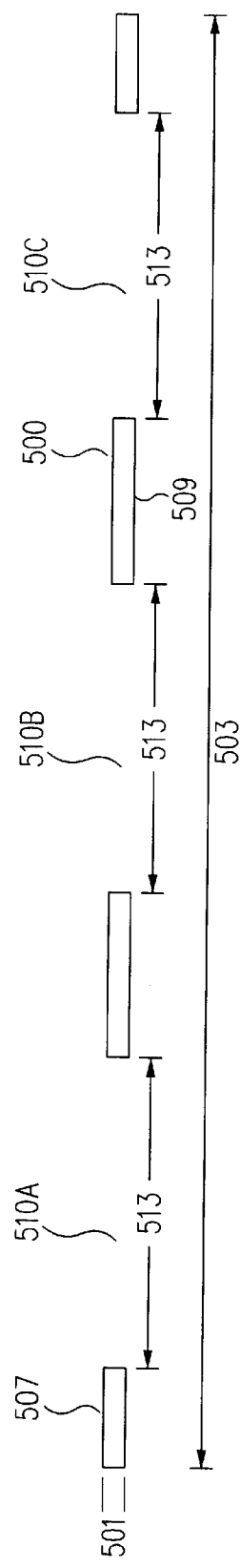
FIG. 5B shows an enlarged view of multi-package substrate, as it would be seen along line 5B—5B in FIG. 5A.
Figure 5C:
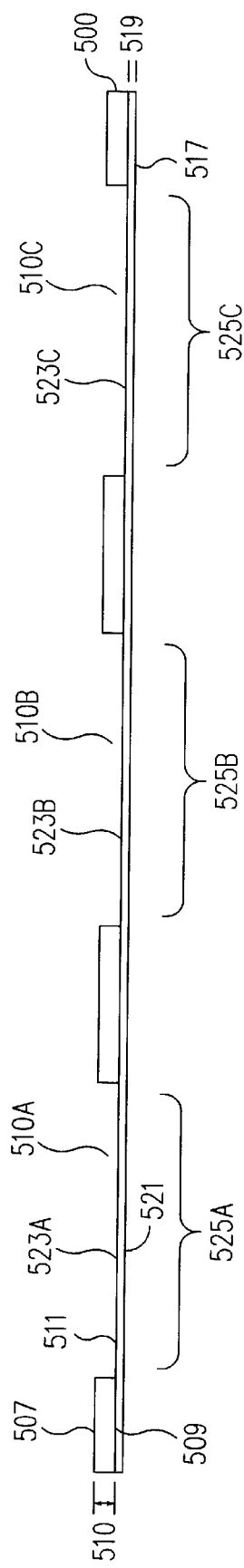
FIG. 5C shows multi-package substrate including tape applied in accordance with the invention.

In one embodiment of the invention, several electronic devices are packaged at once by providing a large, multi-package substrate and forming a matrix of multiple holes in the multi-package substrate (FIG. 5A and FIG. 5B). The multiple holes are cut through the multi-package substrate, from a fist surface of the multi-package substrate to a second surface of the multi-package substrate. According to the invention, the holes are made large enough to position an entire electronic device within each hole. A tape is then applied to the second surface of the multi-package substrate to cover a second side of each hole, thereby creating a tape surface at the bottom of each hole (FIG. 5C). Electronic devices are then positioned, one electronic device within a corresponding hole, such that a second surface of each electronic device is in contact with, and adhered to, the tape surface at the bottom of its corresponding hole (FIG. 5D).

Once the electronic devices are positioned at the bottom of their corresponding holes and adhered to the tape surface at the bottom of their corresponding holes, electronic connections are made between the electronic devices and the multi-package substrate using known methods such as wire bonding (FIG. 5E). With the electronic connections made, a layer of encapsulant is applied to a first surface of the electronic devices, a first surface of the multi-package substrate, the electronic connections, e.g., the bond wires, and to fill in any gaps between the electronic devices and the sides of their corresponding holes (FIG. 5H). The encapsulant is then dried or cured and the individual electronic devices are then singulated by methods well known to those of skill in the art (FIG. 5I).

The structure of the present invention is particularly well suited to packaging multiple sensor devices such as sensor dice. In this embodiment, the electronic devices (510A, 510B, 510C in FIG. 5H) are sensor dice and an optical element (541A, 541B, 541C), such as a glass plate or lens, is placed over the active surface of each sensor die to cover a first region of the first surface of each sensor die, before the encapsulant is applied. Then, the encapsulant is applied to: the first surface of the multi-package substrate; the portions of the first surface of the sensor dice not covered by the optical elements; the electronic connections, i.e., the bond wires; and to fill in any gaps between the sensor dice and the sides of their corresponding holes. In this embodiment of the invention, the encapsulant does not cover a first surface of the optical elements (543A, 543B, 543C), however, the encapsulant covers the sides (547A, 547B, 547C) of the optical elements and serves to surround and hold the optical elements in place over the active regions of the sensor dice. The encapsulant is then dried or cured and the individual packaged sensor dice are then singulated using methods well known to those of skill in the art.

Using the structure of the invention, packaged electronic devices are provided which are thinner, require less materials, are less expensive, and can be manufactured using industry standard materials and equipment. In particular, according to the invention, the electronic device is situated within the substrate. Therefore, in contrast to the prior art, the packaged electronic devices made according to the invention are thinner because the thickness of the substrate is not added to the thickness of the electronic device.

In addition, according to the invention, the electronic device is held in position by the tape surface at the bottom of the hole and then by the encapsulant surrounding and covering, at least a portion, of the electronic device. Consequently, and in contrast to the prior art, the packaged electronic devices of the invention do not require expensive adhesives, the labor, or step, to apply these adhesives or the added thickness of these adhesives.

In addition, when the structure of the invention is used to package sensor devices, such as sensor die, the package is not only thinner and protected from the elements, but the optical element is held in position by the encapsulant. Consequently, and in contrast to the prior art, there is no need for a sensor housing mounted around the sensor die and to the printed circuit motherboard. Therefore, using the invention, the sensor dice can be packaged more cheaply than prior art devices and, in contrast to prior art systems, the senor dice can be serviced and replaced in the field. The resulting packaged sensor die is also smaller, thinner, lighter, and less expensive to produce than prior art sensor die systems.

Figure 2:
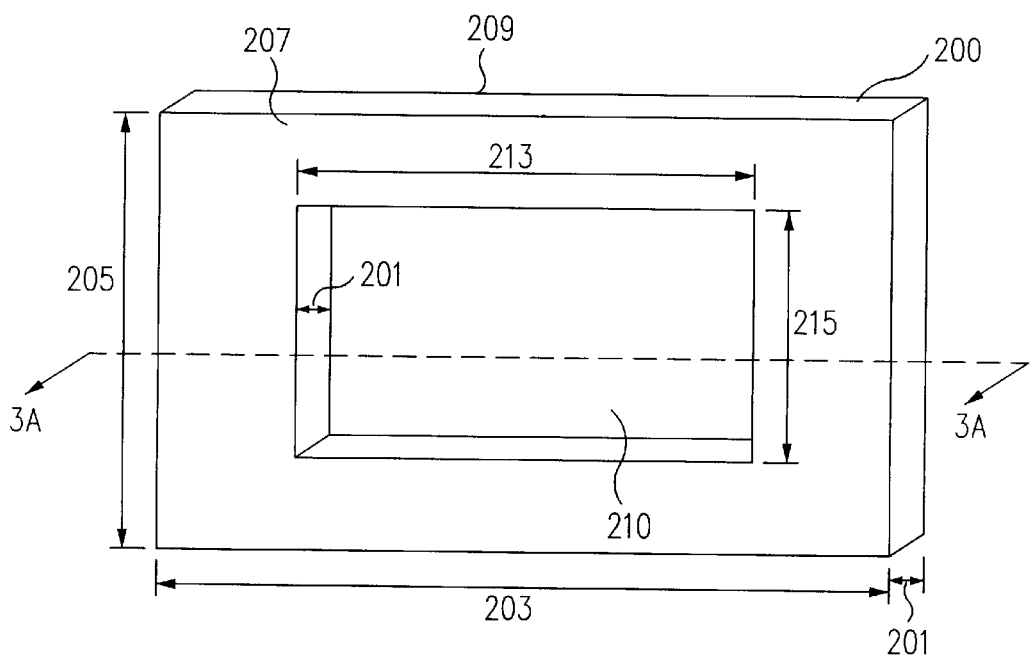
FIG. 2 shows a substrate according to one embodiment of the invention.

FIG. 2 shows a substrate 200 according to one embodiment of the invention. In one embodiment of the invention, substrate 200 is formed of well-known materials such as printed circuit board, ceramic or tape.

As seen in FIG. 2, substrate 200 has a thickness 201, a length 203 and a width 205. As also seen in FIG. 2, substrate 200, according to the invention, includes a hole 210. In one embodiment of the invention, hole 210 extends from a first surface 207 of substrate 200 to a second surface 209 of substrate 200, i.e., hole 210 extends completely through substrate 200. Hole 210 has a side thickness 201, a length 213 and a width 215. Since, in one embodiment of the invention, hole 210 extends completely through substrate 200, hole 210 has a side thickness 201 identical to substrate thickness 201.

FIG. 3A shows an enlarged view of substrate 200, as it would be seen along line 3A—3A in FIG. 2. FIG. 3A also shows substrate thickness 201, substrate length 203, hole 210, hole length 213, substrate first surface 207 and substrate second surface 209.

FIG. 3B shows substrate 200 including tape 300. According to the invention, tape 300 is applied to substrate second surface 209. In one embodiment of the invention tape 300 is polyamid tape that is well known to those of skill in the art. However, in other embodiments of the invention, other types of tape are used.

Tape 300 typically has a first surface 311, a second surface 313 and a thickness 301 between tape first surface 311 and tape second surface 313 of approximately 2.0 to 3.0 mils. According to the invention, tape 300 is applied to second surface 209 of substrate 200 such that tape 300 covers hole 210 and creates a hole bottom 305 comprised of a portion 315 of tape first surface 311. As also shown in FIG. 3B, the application of tape 300 to substrate 200 yields a combined substrate/tape thickness 303.

According to the invention, once tape 300 is applied to second surface 209 of substrate 200 as described above, an electronic device is positioned in hole 210 on portion 315 of first surface 311 of tape 300. FIG. 3C shows substrate 200 including tape 300 with electronic device 320 positioned in hole 210 on portion 315 of first surface 311 of tape 300. As seen in FIG. 3C, electronic device 320 includes a first surface 322 and a second surface 324. According to the invention, second surface 324 of electronic device 320 is attached to portion 315 of first surface 311 of tape 300. In this way, electronic device 320 is stabilized by tape 300 during die electrical attachment, as discussed below. Electronic device 320 can be any one of numerous and well known electronic devices such as an integrated circuit. (IC), a microprocessor, a sensor die, a discrete component, a memory or any other electronic device. As discussed in more detail below, the invention is particularly well suited to use with sensor dice.

Once electronic component 320 is attached to portion 315 of surface 311 of tape 300 in hole 210 as shown in FIG. 3C, electronic component 320 sits within hole 210 with gaps 326 between the sides of electronic device 320 and the walls 340 of hole 210. In one embodiment of the invention, first surface 322 of electronic device 320 rises a height 331 above first surface 207 of substrate 200. In another embodiment of the invention, first surface 322 is lower than, or flush with, first surface 207 of substrate 200. Importantly however is the fact that, according to the invention, second surface 324 of electronic device 320 is positioned below first surface 207 of substrate 200 because electronic device 320 is positioned within hole 210. Consequently, and in contrast to the prior art, electronic device 320 does not add significantly to the thickness of the structure and combined thickness 333 of the structure is significantly less than the combined thickness 201 of substrate 200 and thickness 328 of electronic device 320.

FIG. 3D is an enlarged overhead view of the structure of FIG. 3C including substrate 200 with substrate first surface 207 and electronic device 320 with electronic device first surface 322. Also shown in FIG. 3D are gaps 326 between sides 330 of electronic device 320 and walls 340 of hole 210. Also shown in FIG. 3D are portions 305A of first surface 311 of tape 300 at the bottom of gaps 326.

As shown in FIG. 3E, once electronic device 320 is positioned in hole 210 and held in place by tape 300, as discussed above with respect to FIG. 3C and FIG. 3D, electronic device 320 is electrically coupled to substrate 200 using bond wires 350 to connect bonding pads 358 located on first surface 322 of electronic device 320 to corresponding contacts 356 on first surface 207 of substrate 200 using well known conventional bonding techniques. In one embodiment of the invention, contacts 356 are connected to metallizations (not shown) on first surface 207 of substrate 200. In one embodiment of the invention, electrically conductive vias (not shown) electrically couple metallizations (not shown) on first surface 207 of substrate 200 to metallizations (not shown) on second surface 209 of substrate 200. Wire bonding, metallizations, bonding pads, contacts and electrically conductive vias are well known in the art and are discussed in more detail above. Consequently, these structures and techniques will not be discussed in more detail here to avoid detracting from the present invention.

Figure 3F:
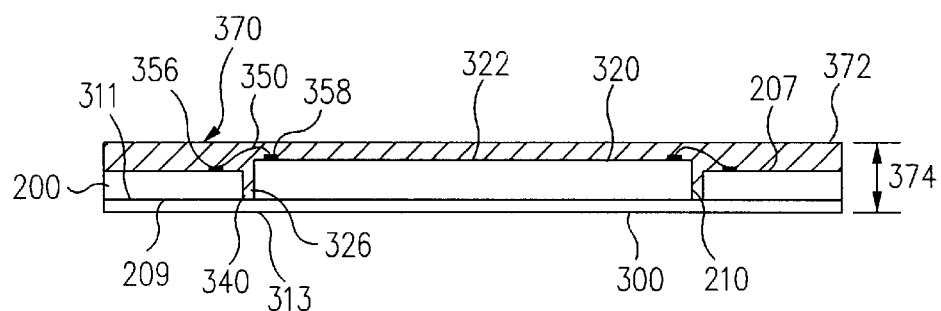
FIG. 3F shows the structure of FIG. 3E further including a layer of encapsulant that is applied over the entire assembly according to the principles of one embodiment of the invention.

As shown in FIG. 3F, a layer of encapsulant 370 is then applied over the entire assembly. In particular, layer of encapsulant 370 covers: first surface 207 of substrate 200; contacts 356; bond wires 350; bonding pads 358; and first surface 322 of electronic device 320. In addition, encapsulant 370 fills in gaps 326 of hole 210. Consequently, using the structure of the invention, encapsulant 370 provides the stability for the packaged electronic device however, unlike prior art structures, encapsulant 370 does not add significantly to the thickness of the package.

Typically, encapsulant 370 is formed of an electrically insulating encapsulant and can be laser marked for product identification using conventional laser marking techniques. Encapsulant 370 is typically applied as a liquid and then dries, or is cured, to a hardened solid.

Figure 3G:
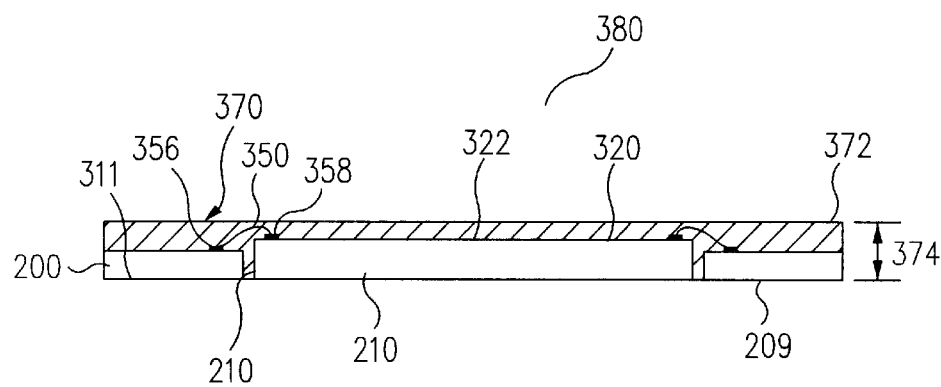
FIG. 3G shows the resulting package structure with the tape removed according to one embodiment of the present invention.

Once encapsulant 370 hardens, tape 300 is removed. FIG. 3G shows the resulting package structure 380. Package structure 380 has an overall thickness 374 measured from encapsulant first surface 372 to substrate second surface 209. According to the invention, since electronic device 320 is positioned at least partially within hole 210, overall thickness 374 is significantly less than prior art structures that simply positioned electronic device 320 on top of first surface 207 of substrate 200. Consequently, while in the prior art the overall thickness 60 (see FIG. 1) was on the order of 1.1 to 2.0 millimeters, overall thickness 374 of packaged electronic devices according to the invention are on the order of 0.3 to 0.5 millimeters.

Figure 3H:
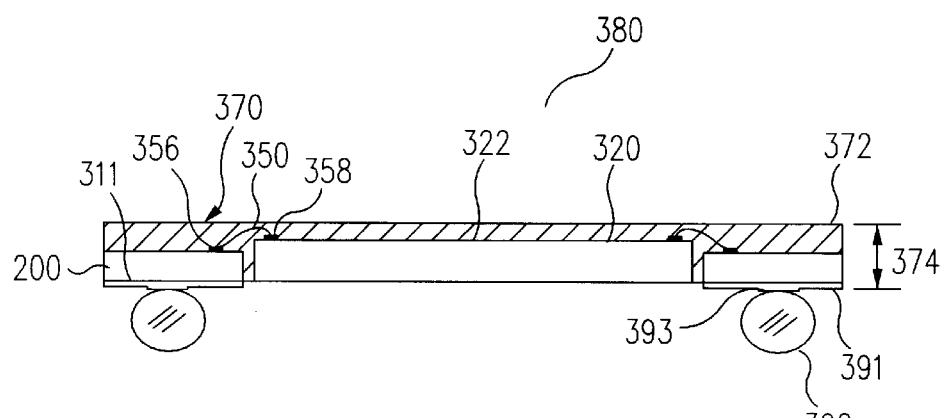
FIG. 3H shows one embodiment of the invention that is a ball grid array, in which interconnection balls, typically eutectic solder balls, are attached to contacts on a second surface of the substrate.

As shown in FIG. 3H, in one embodiment of the invention, interconnection balls 390, typically eutectic solder balls, are attached to contacts 393 using conventional techniques. Contacts 393 are, in turn, coupled to metallizations 391 on second surface 209 of substrate 200. Interconnection balls 390 are typically arranged in an array thus forming a ball grid array. In an alternative embodiment, contacts 393 form interconnection pads for electrical interconnection with other components and interconnection balls 390 are not formed.

Using the structure of the invention, packaged electronic devices 380 are provided which are thinner, require less materials, are less expensive, and can be manufactured using industry standard materials and equipment. In particular, according to the invention, electronic device 320 is situated within the substrate 200, as opposed to positioning electronic device 320 on top of substrate 200 as was done in the prior art. Therefore, in contrast to the prior art, packaged electronic devices 380 made according to the invention are thinner because the thickness of substrate 200 is not added to the thickness of electronic device 320.

In addition, according to the invention, electronic device 320 is held in position by tape first surface 311 at the bottom of hole 210 and then by encapsulant 370 surrounding and covering, at least a portion, of electronic device 320. Consequently, and in contrast to the prior art, the packaged electronic devices 380 of the invention do not require expensive adhesives, the labor, or the additional step, to apply these adhesives or the added thickness of these adhesives.

The structure of the present invention is particularly well suited to packaging sensor devices such as sensor dice. In this embodiment, an optical element, such as a glass plate or lens, is placed over the active surface of the sensor die to cover an active region of the first surface of the sensor die, before the encapsulant is applied. Then, the encapsulant is applied to: the first surface of the substrate; the portion of the first surface of the sensor die not covered by the optical element; the electronic connections, e.g., the bond wires; and to fill in any gaps between the sensor die and the sides of the hole. In this embodiment of the invention, the encapsulant does not cover a first surface of the optical element, however, the encapsulant covers the sides of the optical element and serves to surround and hold the optical element in place over the active region of the sensor die.

Using the method and structure of the invention to package a sensor die involves the identical steps discussed above with respect to FIG. 3A and FIG. 3B, i.e., substrate 200 is provided and tape 300 is applied. A sensor package structure 400A is shown in FIG. 4A. As shown in FIG. 4A, a sensor die 420 is then positioned in hole 210 on portion 315 of first surface 311 of tape 300. As seen in FIG. 4A, sensor die 420 includes a first surface 422 and a second surface 424. According to the invention, second surface 424 of sensor die 420 is attached to portion 315 of first surface 311 of tape 300. In this way, sensor die 420 is stabilized by tape 300 during die electronic attach, as discussed below. Sensor die 420 can be any one of numerous and well known sensor dice which typically include an active region 423 on first surface 422 of sensor die 420. The structure and operation of sensor dice, such as sensor die 420, is well know to those of skill in the art. Consequently, the details of the structure and operation of sensor dice will not be discussed herein to avoid detracting from the invention.

Once sensor die 420 is attached to portion 315 of surface 311 of tape 300 in hole 210 as shown in FIG. 4A, sensor die 420 sits within hole 210 with gaps 326 between sides 430 of sensor die 420 and the walls 340 of hole 210. In one embodiment of the invention, first surface 422 of sensor die 420 rises a height 431 above first surface 207 of substrate 200. In another embodiment of the invention, first surface 422 is lower than, or flush with, first surface 207 of substrate 200. Importantly however is the fact that, according to the invention, second surface 424 of sensor die 420 is positioned below first surface 207 of substrate 200 because sensor die 420 is positioned within hole 210. Consequently, and in contrast to the prior art, sensor die 420 does not add significantly to the thickness of the structure.

As also shown in FIG. 4A, sensor package structure 400A includes an optical element 450. Optical element 450 can be any one of numerous optical elements including a simple plane of glass, a shaped lens or a plastic or acrylic component. The purpose of optical element 450 is to cover, protect, and/or focus light on active region 423 of first surface 422 of sensor die 420. As seen in FIG. 4A, optical element 450 includes optical element first surface 451, optical element second surface 453, and optical element sides 455. According to one embodiment of the invention, second surface 453 of optical element 450 is placed directly on active region 423 of first surface 422 of sensor die 420. In this embodiment of the invention, no adhesive is used to hold optical element 450 in place. However, in other embodiments of the invention an adhesive is used and is applied to a perimeter of optical element 450 on optical element second surface 453, between optical element second surface 453 and first surface 422 of sensor die 420.

Figure 4B:
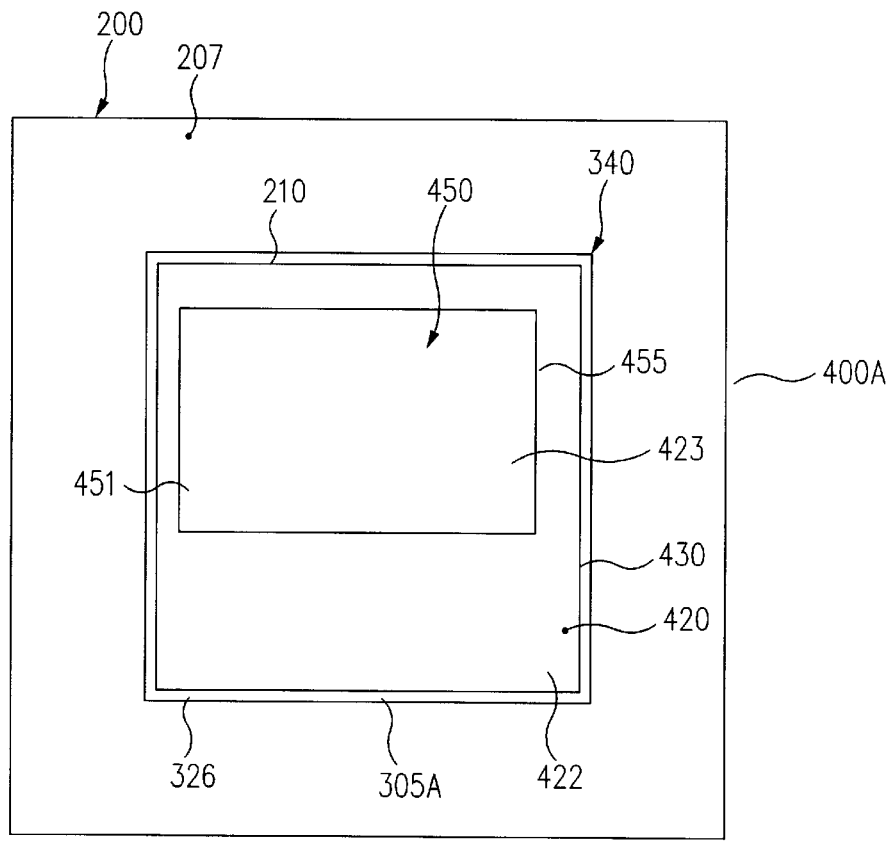
FIG. 4B is an enlarged overhead view of the sensor package structure of FIG. 4A.

FIG. 4B is an enlarged overhead view of sensor package structure 400A from FIG. 4A including: substrate 200 with substrate first surface 207; sensor die 420 with sensor die first surface 422 and active region 423; and optical element 450 with optical element first surface 451. Also shown in FIG. 4B are gaps 326 between sides 430 of sensor die 420 and walls 340 of hole 210. Also shown in FIG. 4B are portions 305A of first surface 311 of tape 300 at the bottom of gaps 326.

Figure 4C:
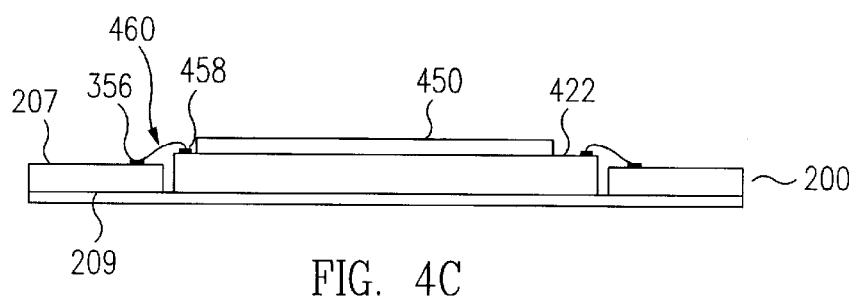
FIG. 4C shows the structure of FIG. 4B further including a sensor die electrically coupled to the substrate using bond wires according to the principles of one embodiment of the invention.

As shown in FIG. 4C, once sensor die 420 is positioned in hole 210 and held in place by tape 300, as discussed above with respect to FIG. 4A and FIG. 4B, sensor die 420 is electrically coupled to substrate 200 using bond wires 460 to connect bonding pads 458 located on first surface 422 of sensor die 420 to corresponding contacts 356 on first surface 207 of substrate 200 using well known conventional bonding techniques. In one embodiment of the invention, contacts 356 are connected to metallizations (not shown) on first surface 207 of substrate 200. In one embodiment of the invention, electrically conductive vias (not shown) electrically couple metallizations (not shown) on first surface 207 of substrate 200 to metallizations (not shown) on second surface 209 of substrate 200. Wire bonding, metallizations, bonding pads, contacts and electrically conductive vias are well known in the art and are discussed in more detail above. Consequently, these structures and techniques will not be discussed in more detail here to avoid detracting from the present invention.

Figure 4D:
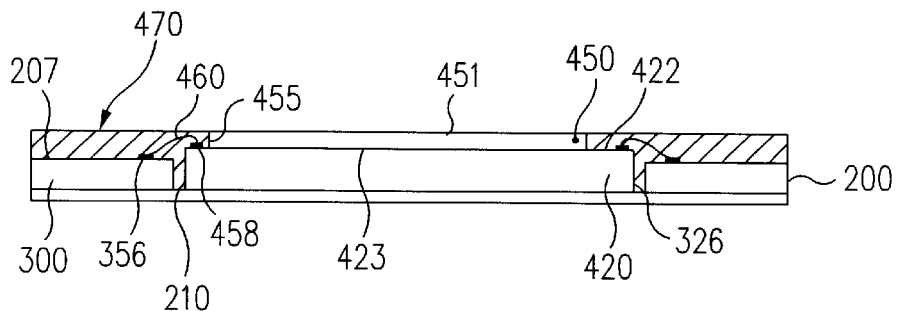
FIG. 4D shows the structure of FIG. 4C further including a layer of encapsulant that is applied over the entire assembly except a first surface of the optical element in accordance with the principles of one embodiment of the invention.

As shown in FIG. 4D, a layer of encapsulant 470 is then applied over the entire assembly except optical element first surface 451. In particular, layer of encapsulant 470 covers: first surface 207 of substrate 200; contacts 356; bond wires 460; bonding pads 458; first surface 422 of sensor die 420, except active region 423; and optical element sides 455. In addition, encapsulant 470 fills in gaps 326 of hole 210. Consequently, using the structure of the invention, encapsulant 470 provides the stability for the packaged electronic device however, unlike prior art structures, encapsulant 470 does not add significantly to the thickness of the package. In addition, encapsulant 470 secures optical element 450 in place by surrounding and covering optical element sides 455.

Typically, encapsulant 470 is formed of an electrically insulating encapsulant and can be laser marked for product identification using conventional laser marking techniques. Encapsulant 470 is typically applied as a liquid and then dries, or is cured, to a hardened solid.

As discussed above, once encapsulant 470 hardens, optical element 450 is held in place by encapsulant 470 by virtue of the fact that encapsulant 470 surrounds and covers optical element sides 455. Consequently, according to the invention, no adhesives are required to hold optical element 450 in place.

Figure 4E:
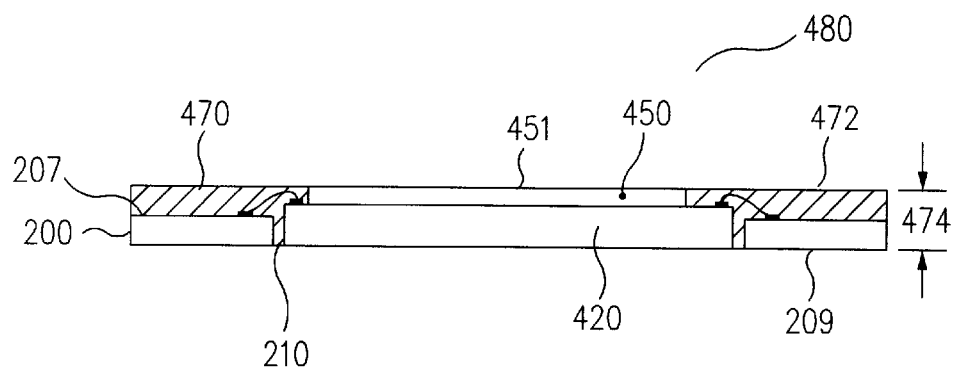
FIG. 4E shows the resulting packaged sensor die with the tape removed according to one embodiment of the present invention.

Once encapsulant 470 hardens, tape 300 is removed. FIG. 4E shows the resulting packaged sensor die 480. Packaged sensor die 480 has an overall thickness 474 measured from encapsulant first surface 472 to substrate second surface 209. According to the invention, since sensor die 420 is positioned at least partially within hole 210, overall thickness 474 is significantly less than prior art structures that simply positioned sensor die 420 on top of first surface 207 of substrate 200. Consequently, while in the prior art the overall thickness 60 (see FIG. 1) was on the order of 1.1 to 2.0 millimeters, overall thickness 474 of packaged electronic devices according to the invention are on the order of 0.3 to 0.5 millimeters.

Figure 4F:
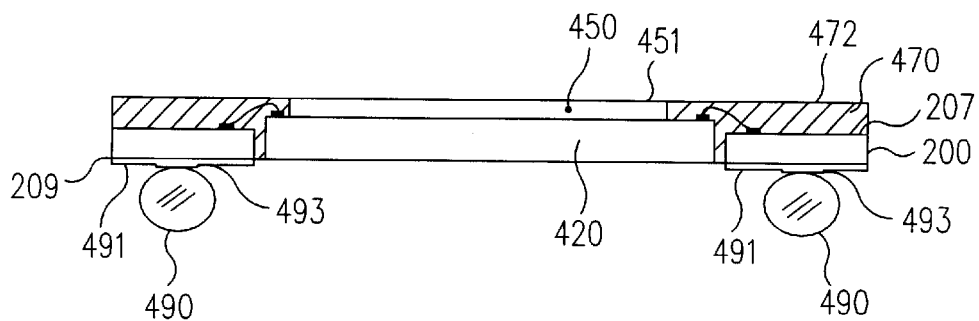
FIG. 4F shows one embodiment of the invention that is a packaged sensor die ball grid array, in which interconnection balls, typically eutectic solder balls, are attached to contacts on a second surface of the substrate.

As shown in FIG. 4F, in one embodiment of the invention, interconnection balls 490, typically eutectic solder balls, are attached to contacts 493 using conventional techniques. Contacts 493 are, in turn, coupled to metallizations 491 on second surface 209 of substrate 200. Interconnection balls 490 are typically arranged in an array thus forming a ball grid array. In an alternative embodiment, contacts 493 form interconnection pads for electrical interconnection with other components and interconnection balls 490 are not formed.

Using the method and structure of the invention, packaged sensor dice 480 are provided which are thinner, require less materials, are less expensive, and can be manufactured using industry standard materials and equipment. In particular, according to the invention, sensor die 420 is situated within substrate 200. Therefore, in contrast to the prior art, packaged sensor dice 480 made according to the invention are thinner because the thickness of substrate 200 is not added to the thickness of sensor die 420.

In addition, according to the invention, sensor die 420 is held in position by tape 300 at the bottom hole 210 and then by encapsulant 470 surrounding and covering, at least a portion, of the sensor die 420. Consequently, and in contrast to the prior art, the packaged sensor dice 480 of the invention do not require expensive adhesives, the labor, or the step, to apply these adhesives or the added thickness of these adhesives.

In addition, optical element 450 is held in position by encapsulant 470. Consequently, and in contrast to the prior art, there is no need for a sensor housing mounted around sensor die 420 and to the printed circuit motherboard. Therefore, using the invention, sensor dice 420 can be packaged more cheaply than prior art devices and, in contrast to prior art systems, optical senor die 420 can be serviced and replaced in the field. The resulting packaged sensor die 480 is also smaller, thinner, lighter, and less expensive to produce than prior art sensor die systems.

In one embodiment of the invention, several electronic devices are packaged at once. As discussed above, the method and structure of the present invention is particularly well suited to packaging multiple sensor devices such as sensor dice. In this embodiment, the electronic devices are sensor dice and an optical element such as a glass plate or lens is placed over the active surface of each sensor die to cover an active, or first, region of the first surface of each sensor die, before the encapsulant is applied. Then, the encapsulant is applied to: the first surface of the multi-package substrate; the portions of the first surface of the sensor dice not covered by the optical elements; the electronic connections, e.g., the bond wires; and to fill in any gaps between the sensor dice and the sides of their corresponding holes. In this embodiment of the invention, the encapsulant does not cover a first surface of the optical elements, however, the encapsulant covers the sides of the optical elements and serves to surround and hold the optical elements in place over the active regions of the sensor dice. The encapsulant is then dried or cured and the individual packaged sensor dice are then singulated using methods well known to those of skill in the art.

FIG. 5A shows a muti-package substrate 500 according to one embodiment of the invention. In one embodiment of the invention, multi-package substrate 500 is formed of well-known materials such as printed circuit board, ceramic or tape.

As seen in FIG. 5A, in one embodiment of the invention, multi-package substrate 500 has a thickness 501, a length 503 and a width 505. As also seen in FIG. 5A, multi-package substrate 500, according to the invention, includes a plurality of holes 510. In one embodiment of the invention, holes 510 extend from a first surface 507 of multi-package substrate 500 to a second surface 509 of multi-package substrate 500, holes 510 extend completely through multi-package substrate 500. Holes 510 each have a side thickness 501, a length 513 and a width 515. Since, in one embodiment of the invention, holes 510 extend completely through multi-package substrate 500, holes 510 have a side thickness 501 identical to multi-package substrate thickness 501.

FIG. 5B shows an enlarged view of multi-package substrate 500, as it would be seen along line 5B—5B in FIG. 5A. FIG. 5B also shows multi-package substrate thickness 501, multi-package substrate length 503, holes 510A, 510B and 510C, hole lengths 513, multi-package substrate first surface 507 and multi-package substrate second surface 509.

FIG. 5C shows multi-package substrate 500 including tape 517. According to the invention, tape 517 is applied to multi-package substrate second surface 509. In one embodiment of the invention tape 517 is polyamid tape that is well known to those of skill in the art. However, in other embodiments of the invention, other types of tape are used.

Tape 517 typically has a first surface 511, a second surface 521 and a thickness 519 between tape first surface 511 and tape second surface 521 of approximately 2.0 to 3.0 mils. According to the invention, tape 517 is applied to second surface 509 of multi-package substrate 500 such that tape 517 covers holes 510A, 510B and 510C and creates hole bottoms 523A, 523B, and 523C comprised of a portions 525A, 525B and 525C of tape first surface 511.

According to the invention, once tape 517 is applied to second surface 509 of multi-package substrate 500 as described above, an electronic device is positioned in each hole 510A, 510B and 510C on portion 525A, 525B and 525C of first surface 511 of tape 517.

A multi-sensor package structure is shown in FIG. 5D. As shown in FIG. 5D, sensor dice 527A, 527B and 527C, are then positioned, one each, in corresponding holes 510A, 510B and 510C, respectively on portions 525A, 525B and 525C, respectively of first surface 511 of tape 517. As seen in FIG. 5D, sensor dice 527A, 527B and 527C each include a first surface 529A, 529B and 529C, respectively, and a second surface 531A, 531B and 531C, respectively. According to the invention, second surfaces 531A, 531B and 531C are attached to portions 525A, 525B and 525C, respectively, of first surface 511 of tape 517. In this way, sensor dice 527A, 527B and 527C are stabilized by tape 517 during die electronic attach, as discussed below. Sensor dice 527A, 527B and 527C can be any one of numerous and well known sensor dice which typically include an active region 533A, 533B and 533C on first surface 529A, 529B and 529C, respectively, of sensor dice 527A, 527B and 527C. The structure and operation of sensor dice, such as sensor dice 527A, 527B and 527C, is well know to those of skill in the art. Consequently, the details of the structure and operation of sensor dice will not be discussed herein to avoid detracting from the invention.

Once second surfaces 531A, 531B and 531C of sensor dice 527A, 527B and 527C are attached to portions 525A, 525B and 525C, respectively, of first surface 511 of tape 517, sensor dice 527A, 527B and 527C sit within holes 510A, 510B and 510C, respectively, with gaps 535A, 535B and 535C between the sides of sensor dice 527A, 527B and 527C and the walls 537A, 537B and 537C of holes 510A, 510B and 510C, respectively. In one embodiment of the invention, first surfaces 533A, 533B and 533C of sensor dice 527A, 527B and 527C, respectively, rise a height 537 above first surface 507 of multi-package substrate 500. In another embodiment of the invention, first surfaces 533A, 533B and 533C of sensor dice 527A, 527B and 527C, respectively, are lower than, or flush with, first surface 507 of multi-package substrate 500. Importantly however is the fact that, according to the invention, second surface 531A, 531B and 531C of sensor dice 527A, 527B and 527C, respectively, are positioned below first surface 507 of multi-package substrate 500 because sensor dice 527A, 527B and 527C are positioned within holes 510A, 510B and 510C, respectively. Consequently, and in contrast to the prior art, sensor dice 527A, 527B and 527C do not add significantly to the thickness of the structure.

FIG. 5E shows a sensor package structure 502E that is identical to the structure of FIG. 5D but also includes optical elements 541A, 541B and 541C. Each of optical elements 541A, 541B and 541C can be any one of numerous optical elements including a simple plane of glass, a shaped lens or a plastic or acrylic component. The purpose of optical elements 541A, 541B and 541C is to cover, protect, and/or focus light on active regions 533A, 533B and 533C, respectively, of first surfaces 529A, 529B and 529C of sensor dice 527A, 527B and 527C, respectively. As seen in FIG. 5E, optical elements 541A, 541B and 541C include optical element first surfaces 543A, 543B and 543C, optical element second surfaces 545A, 545B and 545C, and optical element sides 547A, 547B and 547C, respectively. According to one embodiment of the invention, second surfaces 545A, 545B and 545C of optical element 541A, 541B and 541C, respectively, are placed directly on active regions 533A, 533B and 533C, respectively, of first surfaces 529A, 529B and 529C of sensor dice 527A, 527B and 527C, respectively. In this embodiment of the invention, no adhesive is used to hold optical elements 541A, 541B and 541C in place. However, in other embodiments of the invention an adhesive is used and is applied to a perimeter of optical element 541A, 541B and 541C on optical element second surfaces 545A, 545B and 545C, between optical element second surfaces 545A, 545B and 545C and first surfaces 529A, 529B and 529C of sensor dice 527A, 527B and 527C, respectively.

Figure 5F:
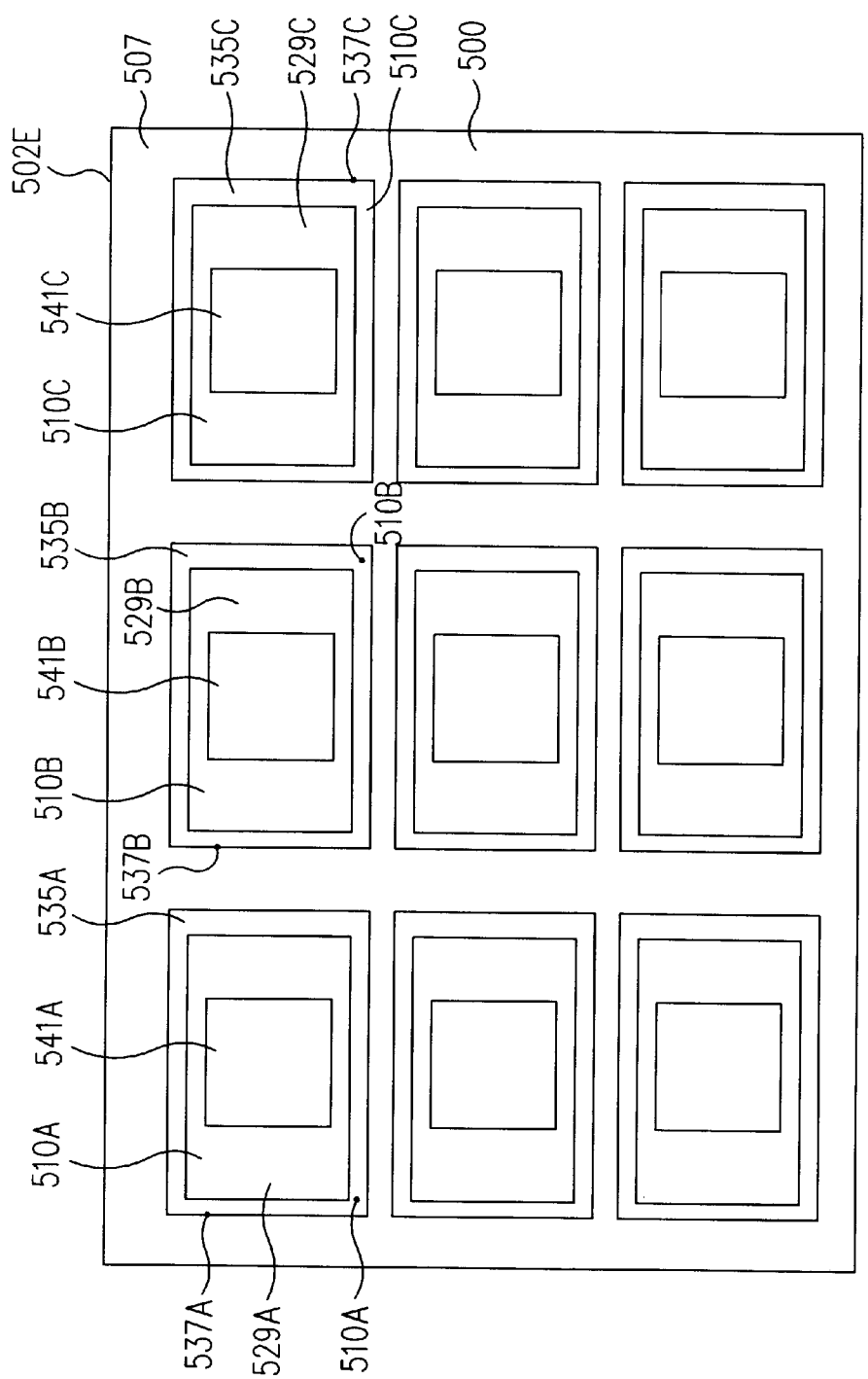
FIG. 5F is an enlarged overhead view of muti-sensor package structure from FIG. 5E.

FIG. 5F is an enlarged overhead view of sensor package structure 502E from FIG. 5E including: multi-package substrate 500 with multi-package substrate first surface 507; sensor dice 510A, 510B and 510C with sensor die first surfaces 529A, 529B and 529C; and optical elements 541A, 541B and 541C, respectively. Also shown in FIG. 5F are gaps 535A, 535B and 535C between sensor dice 527A, 527B and 527C and walls 537A, 537B and 537C of holes 510A, 510B and 510C, respectively.

Figure 5G:
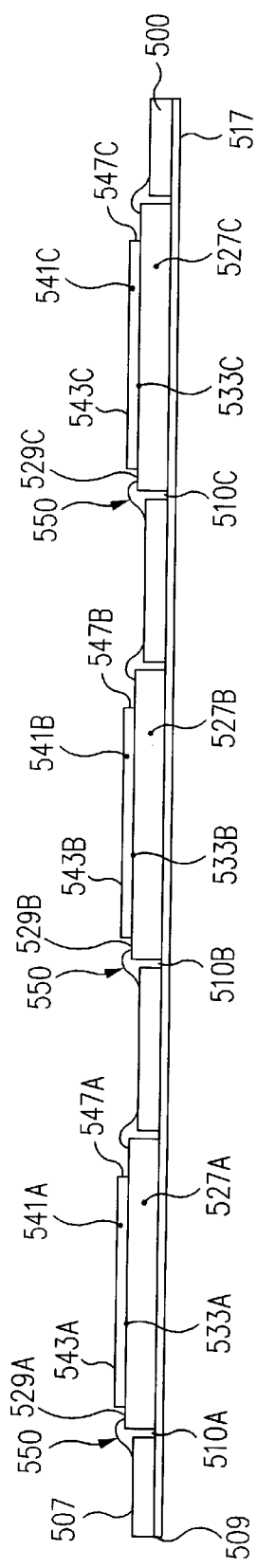
FIG. 5G shows the structure of FIG. 4B further including the sensor die electrically coupled to the multi-package substrate using bond wires according to the principles of one embodiment of the invention.
Figure 5H:
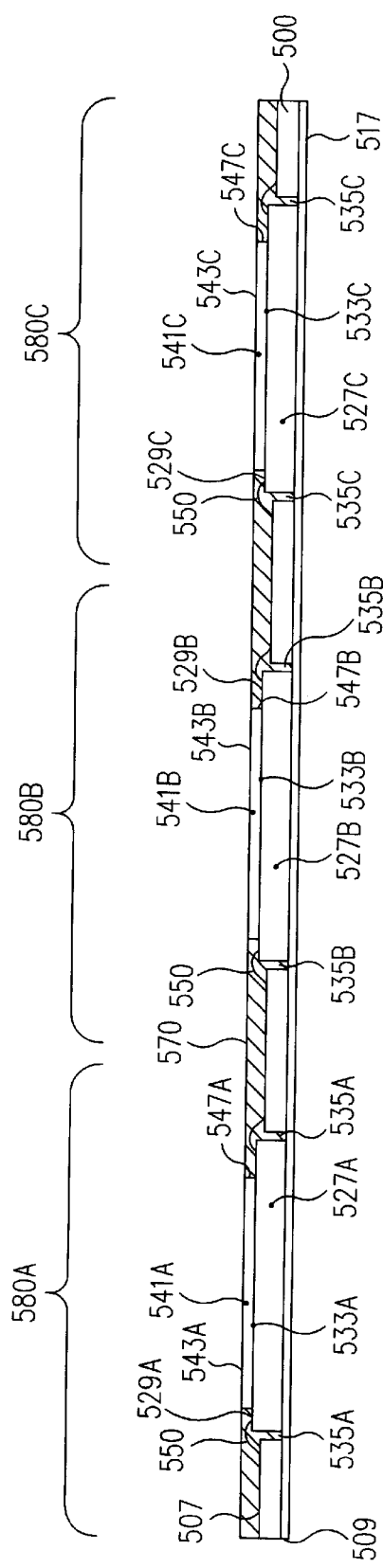
FIG. 5H shows the structure of FIG. 5G further including a layer of encapsulant that is applied over the entire assembly except a first surface of the optical elements in accordance with the principles of one embodiment of the invention.
Figure 5I:
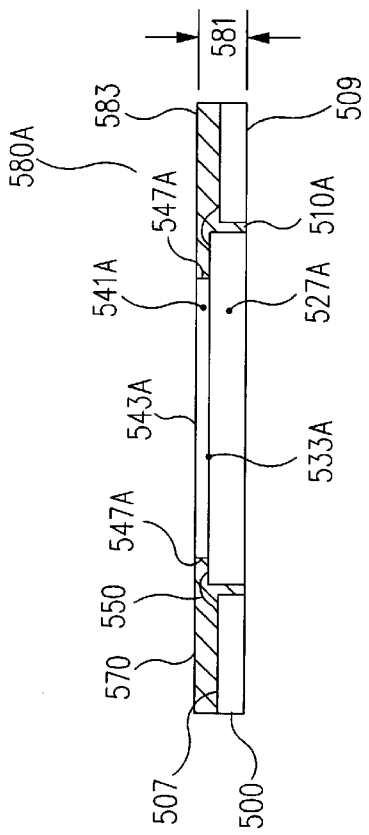
FIG. 5I shows the resulting sigulated packaged sensor die with the tape removed according to one embodiment of the present invention.

As shown in FIG. 5G, once sensor dice 527A, 527B and 527C are positioned in holes 510A, 510B and 510C, respectively, and held in place by tape 517, as discussed above, sensor dice 527A, 527B and 527C are electrically coupled to multi-package substrate 500 using bond wires 550 to connect bonding pads (not shown) located on first surfaces 529A, 529B and 529C of sensor dice 527A, 527B and 527C, respectively, to corresponding contacts (not shown) on first surface 507 of multi-package substrate 500 using well known conventional bonding techniques. In one embodiment of the invention, the contacts (not shown) on first surface 507 of multi-package substrate 500 are connected to metallizations (not shown) on first surface 507 of multi-package substrate 500. In one embodiment of the invention, electrically conductive vias (not shown) electrically couple metallizations (not shown) on first surface 507 of multi-package substrate 500 to metallizations (not shown) on second surface 509 of multi-package substrate 500. Wire bonding, metallizations, bonding pads, contacts and electrically conductive vias are well known in the art and are discussed in more detail above. Consequently, these structures and techniques will not be discussed in more detail here to avoid detracting from the present invention.

As shown in FIG. 5H, a layer of encapsulant 570 is then applied over the entire assembly except optical element first surfaces 543A, 543B and 543C. In particular, layer of encapsulant 570 covers: first surface 507 of multi-package substrate 500; bond wires 550; first surfaces 529A, 529B and 529C of sensor dice 527A, 527B and 527C, respectively, except active regions 533A, 533B and 533C; and optical element sides 547A, 547B and 547C. In addition, encapsulant 570 fills in gaps 535A, 535B and 535C of holes 510A, 510B and 510C. Consequently, using the structure of the invention, encapsulant 570 provides the stability for the packaged electronic device however, unlike prior art structures, encapsulant 570 does not add significantly to the thickness of the package. In addition, encapsulant 570 secures optical elements 541A, 541B and 541C in place by surrounding and covering optical element sides 535A, 535B and 535C.

Typically, encapsulant 570 is formed of an electrically insulating encapsulant and can be laser marked for product identification using conventional laser marking techniques. Encapsulant 570 is typically applied as a liquid and then dries, or is cured, to a hardened solid.

As discussed above, once encapsulant 570 hardens, optical elements 541A, 541B 541C sides 547A, 547B and 547C, respectively, are held in place by encapsulant 570 by virtue of the fact that encapsulant 570 surrounds and covers optical elements 541A, 541B and 541C. Consequently, according to the invention, no adhesives are required to hold optical elements 541A, 541B and 541C in place.

Once encapsulant 570 hardens, individual packaged sensor dice 580A, 580B and 580C are singulated using methods well know to those of Skill in the art and tape 517 is removed. FIG. 5I shows an exemplary resulting packaged sensor die 580A. Packaged sensor die 580A has an overall thickness 581 measured from encapsulant first surface 583 to substrate second surface 509. According to the invention, since sensor die 527A is positioned at least partially within hole 510A, overall thickness 581 is significantly less than prior art structures that simply positioned sensor die 527A on top of first surface 507 of multi-package substrate 500. Consequently, while in the prior art the overall thickness 60 (see FIG. 1) was on the order of 1.1 to 2.0 millimeters, overall thickness 581 of packaged electronic devices according to the invention are on the order of 0.3 to 0.5 millimeters.

Figure 5J:
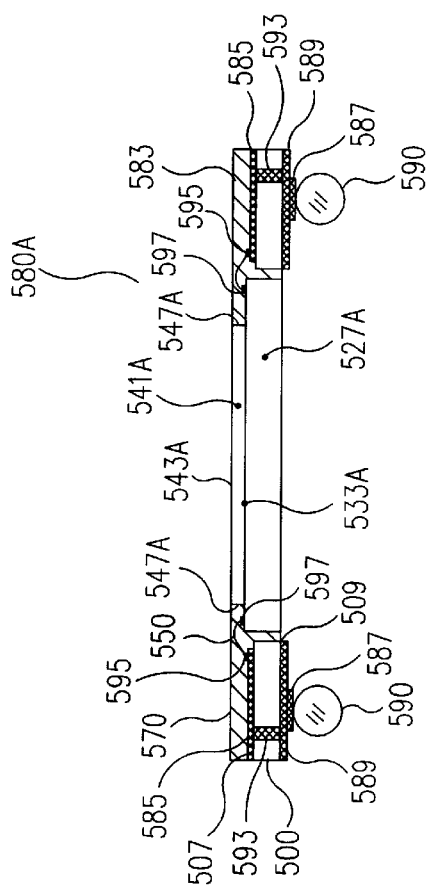
FIG. 5J shows one embodiment of the invention that is a packaged sensor die ball grid array, in which interconnection balls, typically eutectic solder balls, are attached to contacts on a second surface of the substrate.

As shown in FIG. 5J, in one embodiment of the invention, interconnection balls 590, typically eutectic solder balls, are attached to contacts 587 using conventional techniques. Contacts 587 are, in turn, coupled to metallizations 589 on second surface 509 of multi-package substrate 500. Interconnection balls 590 are typically arranged in an array thus forming a ball grid array. In an alternative embodiment, contacts 587 form interconnection pads for electrical interconnection with other components and interconnection balls 590 are not formed. Also shown in FIG. 5J are metallizations 585 on first surface 507 of multi-package substrate 500. In one embodiment of the invention, metallizations 585 are coupled to metallizations 589 by electrically conductive vias 593. In one embodiment of the invention, contacts 595 are formed on metallizations 585 and are connected to bonding pads 597 on first surface 529A of sensor die 527A by bond wires 550.

Using the method and structure of the invention, packaged sensor dice 580A, 580B and 580C are provided which are thinner, require less materials, are less expensive, and can be manufactured using industry standard materials and equipment. In particular, according to the invention, sensor dice 527A, 527B and 527C are situated within multi-package substrate 500. Therefore, in contrast to the prior art, packaged sensor dice 580A, 580B and 580C made according to the invention are thinner because the thickness of multi-package substrate 500 is not added to the thickness of sensor dice 527A, 527B and 527C.

In addition, according to the invention, sensor dice 527A, 527B and 527C are held in position by tape 517 at the bottom holes 510A, 510B and 510C and then by encapsulant 570 surrounding and covering, at least a portion, sensor dice 527A, 527B and 527C. Consequently, and in contrast to the prior art, the packaged sensor die 580A, 580B and 580C of the invention do not require expensive adhesives, the labor, or the step, to apply these adhesives or the added thickness of these adhesives.

In addition, optical elements 541A, 541B and 541C are held in position by encapsulant 570. Consequently, and in contrast to the prior art, there is no need for a sensor housing mounted around sensor dice 527A, 527B and 527C and to the printed circuit motherboard. Therefore, using the invention, sensor dice 527A, 527B and 527C can be packaged more cheaply than prior art devices and, in contrast to prior art systems, sensor dice 527A, 527B and 527C can be serviced and replaced in the field. The resulting packaged sensor dice 580A, 580B and 580C are also smaller, thinner, lighter, and less expensive to produce than prior art sensor die systems.

As shown above, using the method and structure of the invention, packaged electronic devices are provided which are thinner, require less materials, are less expensive, and can be manufactured using industry standard materials and equipment. In particular, according to the invention, the electronic device is situated within the substrate. Therefore, in contrast to the prior art, the packaged electronic devices made according to the invention are thinner because the thickness of the substrate is not added to the thickness of the electronic device.

In addition, according to the invention, the electronic device is held in position by the tape surface at the bottom of the hole and then by the encapsulant surrounding and covering, at least a portion, of the electronic device. Consequently, and in contrast to the prior art, the packaged electronic devices of the invention do not require expensive adhesives, the labor, or step, to apply these adhesives or the added thickness of these adhesives.

In addition, when the structure of the invention is used to package sensor devices, such as sensor die, the package is not only thinner and protected from the elements, but the optical element is held in position by the encapsulant. Consequently, and in contrast to the prior art, there is no need for a sensor housing mounted around the sensor die and to the printed circuit motherboard. Therefore, using the invention, the sensor dice can be packaged more cheaply than prior art devices and, in contrast to prior art systems, the senor dice can be serviced and replaced in the field. The resulting packaged sensor die is also smaller, thinner, lighter, and less expensive to produce than prior art sensor die systems.

This application is related to: Commonly assigned U.S. patent application Ser. No. 09/711,993 entitled "CHIP SIZE IMAGE SENSOR WIREBOND PACKAGE", listing Glenn et al. as inventors, filed Nov. 13, 2000; and co-filed U.S. patent application, entitled "A REDUCED THICKNESS PACKAGED ELECTRONIC DEVICE", listing Glenn et al. as inventors, which are herein incorporated by reference in their entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. Therefore, the scope of the invention is at least as broad as given by the following claims.

What is claimed is:

1. A method for packaging an electronic device comprising:

providing a substrate, said substrate comprising a substrate first surface and a substrate second surface, opposite said substrate first surface;

providing an electronic device, said electronic device comprising an electronic device first surface and an electronic device second surface, opposite said electronic device first surface;

forming a hole in said substrate first surface, said hole comprising hole sides and a hole bottom surface, said hole bottom surface being large enough to position said second surface of said electronic device on said hole bottom surface;

positioning said electronic device in said hole with said second surface of said electronic device on said hole bottom surface such that a distance between said second surface of said electronic device and said second surface of said substrate is less than a distance between said first surface of said substrate and said second surface of said substrate;

electrically coupling said electronic device to said substrate with electrical connections;

applying a layer of encapsulant to: said first surface of said electronic device; said first surface of said substrate; and said electrical connections; and filling gaps between said electronic device and said hole sides with said encapsulant.

2. The method of claim 1, wherein;

said electrical connections comprise bond wires.

3. The method of claim 1, wherein;

said electronic device is an integrated circuit.

4. A method for packaging an integrated circuit comprising:

providing a substrate, said substrate comprising a substrate first surface and a substrate second surface, opposite said substrate first surface;

providing an integrated circuit chip, said integrated circuit chip comprising an integrated circuit chip first surface and an integrated circuit chip second surface, opposite said integrated circuit chip first surface;

forming a hole in said substrate first surface, said hole comprising hole sides and a hole bottom surface, said hole bottom surface being large enough to position said second surface of said integrated circuit chip on said hole bottom surface;

positioning said integrated circuit chip in said hole with said second surface of said integrated circuit chip on said hole bottom surface such that a distance between said second surface of said integrated circuit chip and said second surface of said substrate is less than a distance between said first surface of said substrate and said second surface of said substrate;

electrically coupling said integrated circuit chip to said substrate with bond wires;

applying a layer of encapsulant to: said first surface of said electronic device; said first surface of said substrate; and said bond wires; and filling gaps between said integrated circuit chip and said hole sides with said encapsulant.

5. A method for packaging an electronic device comprising:

providing a substrate, said substrate comprising a substrate first surface and a substrate second surface, opposite said substrate first surface;

providing an electronic device, said electronic device comprising an electronic device first surface and an electronic device second surface, opposite said electronic device first surface;

forming a hole through said substrate, said hole extending from said substrate first surface to said substrate second surface, said hole comprising hole sides, said hole being large enough to position said second surface of said electronic device in said hole;

applying tape to said second surface of said substrate, said tape covering said hole and thereby forming a hole bottom surface comprising a portion of said tape;

positioning said electronic device in said hole with said second surface of said electronic device on said hole bottom surface such that a distance between said second surface of said electronic device and said second surface of said substrate is less than a distance between said first surface of said substrate and said second surface of said substrate;

electrically coupling said electronic device to said substrate with electrical connections;

applying a layer of encapsulant to: said first surface of said electronic device; said first surface of said substrate; and said electrical connections;

filling gaps between said electronic device and said hole sides with said encapsulant;

allowing said encapsulant to harden; and removing said tape from said second surface of said substrate.

6. The method of claim 5, wherein;
said electrical connections comprise bond wires.

7. The method of claim 5, wherein;
said electronic device is an integrated circuit.

8. A method for packaging an integrated circuit comprising:

providing a substrate, said substrate comprising a substrate first surface and a substrate second surface, opposite said substrate first surface;

providing an integrated circuit, said integrated circuit comprising an integrated circuit first surface and an integrated circuit second surface, opposite said integrated circuit first surface;

forming a hole through said substrate, said hole extending from said substrate first surface to said substrate second surface, said hole comprising hole sides, said hole being large enough to position said second surface of said integrated circuit in said hole;

applying tape to said second surface of said substrate, said tape covering said hole and thereby forming a hole bottom surface comprising a portion of said tape;

positioning said integrated circuit in said hole with said second surface of said integrated circuit on said hole bottom surface such that a distance between said second surface of said integrated circuit and said second surface of said substrate is less than a distance between said first surface of said substrate and said second surface of said substrate;

electrically coupling said integrated circuit to said substrate with bond wires;

applying a layer of encapsulant to: said first surface of said integrated circuit; said first surface of said substrate; and said bond wires;

filling gaps between said integrated circuit and said hole sides with said encapsulant;

allowing said encapsulant to harden; and removing said tape from said second surface of said substrate.

9. The method of claim 8, wherein;
said integrated circuit is a sensor die.

10. A method for packaging a sensor die comprising:

providing a substrate, said substrate comprising a substrate first surface and a substrate second surface, opposite said substrate first surface;

providing a sensor die, said sensor die comprising a sensor die first surface and a sensor die second surface, opposite said sensor die first surface, said sensor die further comprising an active region on said first surface of said sensor die;

providing an optical element, said optical element comprising an optical element first surface, an optical element second surface, opposite said optical element first surface, and optical element sides;

forming a hole through said substrate, said hole extending from said substrate first surface to said substrate second surface, said hole comprising hole sides, said hole being large enough to position said second surface of said sensor die in said hole;

applying tape to said second surface of said substrate, said tape covering said hole and thereby forming a hole bottom surface comprising a portion of said tape;

positioning said sensor die in said hole with said second surface of said sensor die on said hole bottom surface such that a distance between said second surface of said sensor die and said second surface of said substrate is less than a distance between said first surface of said substrate and said second surface of said substrate;

positioning said optical element on said sensor die such that said second surface of said optical element is positioned over said active region of said first surface of said sensor die;

electrically coupling said sensor die to said substrate with electrical connections;

applying a layer of encapsulant to: a portion of said first surface of said sensor die not covered by said optical element; said first surface of said substrate; said electrical connections; and said optical element sides;

filling gaps between said integrated circuit and said hole sides with said encapsulant;

allowing said encapsulant to harden; and removing said tape from said second surface of said substrate, wherein;

said optical element is held in position over said active region of said sensor die first surface, at least in part, by said encapsulant applied to said optical element sides.

11. The method of claim 10, wherein;
said electrical connections comprise bond wires.

12. The method of claim 10, wherein;
A distance from said first surface of said optical element to said second surface of said substrate is in the range of 0.3 to 0.5 millimeters.

13. A method for packaging a sensor die comprising:

providing a substrate, said substrate comprising a substrate first surface and a substrate second surface, opposite said substrate first surface;

providing a sensor die, said sensor die comprising a sensor die first surface and a sensor die second surface, opposite said sensor die first surface, said sensor die further comprising an active region on said first surface of said sensor die;

providing an optical element, said optical element comprising an optical element first surface, an optical element second surface, opposite said optical element first surface, and optical element sides;

forming a hole through said substrate, said hole extending from said substrate first surface to said substrate second surface, said hole comprising hole sides, said hole being large enough to position said second surface of said sensor die in said hole;

applying tape to said second surface of said substrate, said tape covering said hole and thereby forming a hole bottom surface comprising a portion of said tape;

positioning said sensor die in said hole with said second surface of said sensor die on said hole bottom surface such that a distance between said second surface of said sensor die and said second surface of said substrate is less than a distance between said first surface of said substrate and said second surface of said substrate;

positioning said optical element on said sensor die such that said second surface of said optical element is positioned over said active region of said first surface of said sensor die;

electrically coupling said sensor die to said substrate with bond wires;

applying a layer of encapsulant to: a portion of said first surface of said sensor die not covered by said optical element; said first surface of said substrate; said bond wires; and said optical element sides;

filling gaps between said integrated circuit and said hole sides with said encapsulant;

allowing said encapsulant to harden; and removing said tape from said second surface of said substrate, wherein;

said optical element is held in position over said active region of said sensor die first surface, at least in part, by said encapsulant applied to said optical element sides, further wherein;

a distance from said first surface of said optical element to said second surface of said substrate is in the range of 0.3 to 0.5 millimeters.

14. A method for packaging electronic devices comprising:

providing a multi-package substrate, said multi-package substrate comprising a multi-package substrate first surface and a multi-package substrate second surface, opposite said multi-package substrate first surface;

providing a plurality of electronic devices, each electronic device of said plurality of electronic devices comprising an electronic device first surface and an electronic device second surface, opposite said electronic device first surface;

forming a plurality of holes in said multi-package substrate first surface, each of said holes comprising hole sides and a hole bottom surface, each of said hole bottom surfaces being large enough to position one of said second surfaces of said electronic devices on said hole bottom surface;

positioning each of said electronic devices in a corresponding one of said holes with said second surface of said electronic device on said corresponding hole bottom surface such that a distance between said second surfaces of said electronic devices and said second surface of said multi-package substrate is less than a distance between said first surface of said multi-package substrate and said second surface of said multi-package substrate;

electrically coupling each of said electronic devices to said multi-package substrate with electrical connections;

applying a layer of encapsulant to: each of said first surfaces of said electronic devices; said first surface of said multi-package substrate; and said electrical connections;

filling gaps between each of said electronic devices and said hole sides of said corresponding holes with said encapsulant; and singulating packaged electronic devices from said multi-package substrate.

15. The method of claim 14, wherein;

said electrical connections comprise bond wires.

16. The method of claim 14, wherein;

said electronic devices are integrated circuits.

17. A method for packaging integrated circuits comprising:

providing a multi-package substrate, said multi-package substrate comprising a multi-package substrate first surface and a multi-package substrate second surface, opposite said multi-package substrate first surface;

providing a plurality of integrated circuits, each integrated circuit of said plurality of integrated circuits comprising an integrated circuit first surface and an integrated circuit second surface, opposite said integrated circuit first surface;

forming a plurality of holes in said multi-package substrate first surface, each of said holes comprising hole sides and a hole bottom surface, each of said hole bottom surfaces being large enough to position one of said second surfaces of said integrated circuits on said hole bottom surface;

positioning each of said integrated circuits in a corresponding one of said holes with said second surface of said integrated circuit on said corresponding hole bottom surface such that a distance between said second surfaces of said integrated circuits and said second surface of said multi-package substrate is less than a distance between said first surface of said multi-package substrate and said second surface of said multi-package substrate;

electrically coupling each of said integrated circuits to said multi-package substrate with bond wires;

applying a layer of encapsulant to: each of said first surfaces of said integrated circuits; said first surface of said multi-package substrate; and said bond wires;

filling gaps between each of said integrated circuits and said hole sides of said corresponding holes with said encapsulant; and singulating packaged integrated circuits from said multi-package substrate.

18. A method for packaging electronic devices comprising:

providing a multi-package substrate, said multi-package substrate comprising a multi-package substrate first surface and a multi-package substrate second surface, opposite said multi-package substrate first surface;

providing a plurality of electronic devices, each electronic device of said plurality of electronic devices comprising an electronic device first surface and an electronic device second surface, opposite said electronic device first surface;

forming a plurality of holes through said multi-package substrate, said holes extending from said multi-package substrate first surface to said multi-package substrate second surface, each hole of said plurality of holes comprising hole sides, each of said holes being large enough to position one of said second surfaces of said electronic devices in said hole;

applying tape to said second surface of said multi-package substrate, said tape covering each hole of said plurality of holes and thereby forming a hole bottom surface comprising a portion of said tape in each hole;

positioning each of said electronic devices in a corresponding one of said plurality of holes with said second surface of said electronic device on said corresponding hole bottom surface such that a distance between said second surfaces of said electronic devices and said second surface of said multi-package substrate is less than a distance between said first surface of said multi-package substrate and said second surface of said multi-package substrate;

electrically coupling each of said electronic devices to said multi-package substrate with electrical connections;

applying a layer of encapsulant to: said first surface of each of said electronic devices; said first surface of said multi-package substrate; and said electrical connections;

filling gaps between each of said electronic devices and said hole sides of said corresponding holes with said encapsulant;

allowing said encapsulant to harden;

removing said tape from said second surface of said multi-package substrate; and singulating packaged electronic devices from said multi-package substrate.

19. The method of claim 18, wherein;
said electrical connections comprise bond wires.

20. The method of claim 18, wherein;
said electronic devices are integrated circuits.

21. A method for packaging integrated circuits comprising:

providing a multi-package substrate, said multi-package substrate comprising a multi-package substrate first surface and a multi-package substrate second surface, opposite said multi-package substrate first surface;

providing a plurality of integrated circuits, each integrated circuit of said plurality of integrated circuits comprising an integrated circuit first surface and an integrated circuit second surface, opposite said integrated circuit first surface;

forming a plurality of holes through said multi-package substrate, said holes extending from said multi-package substrate first surface to said multi-package substrate second surface, each hole of said plurality of holes comprising hole sides, each of said holes being large enough to position one of said second surfaces of said integrated circuits in said hole;

applying tape to said second surface of said multi-package substrate, said tape covering each hole of said plurality of holes and thereby forming a hole bottom surface comprising a portion of said tape in each hole;

positioning each of said integrated circuits in a corresponding one of said plurality of holes with said second surface of said integrated circuit on said corresponding hole bottom surface such that a distance between said second surfaces of said integrated circuits and said second surface of said multi-package substrate is less than a distance between said first surface of said multi-package substrate and said second surface of said multi-package substrate;

electrically coupling each of said integrated circuits to said multi-package substrate with electrical connections;

applying a layer of encapsulant to: said first surface of each of said integrated circuits; said first surface of said multi-package substrate; and said electrical connections;

filling gaps between each of said integrated circuits and said hole sides of said corresponding holes with said encapsulant;

allowing said encapsulant to harden;

removing said tape from said second surface of said multi-package substrate; and singulating packaged integrated circuits from said multi-package substrate.

22. The method of claim 21, wherein;
said integrated circuits are image sensor dice.

23. A method for packaging sensor dice comprising:

providing a multi-package substrate, said multi-package substrate comprising a multi-package substrate first surface and a multi-package substrate second surface, opposite said multi-package substrate first surface;

providing a plurality of sensor dice, each sensor die of said plurality of sensor dice comprising a sensor die first surface and a sensor die second surface, opposite said sensor die first surface, each sensor die of said plurality of sensor dice further comprising an active region on said first surface of said sensor die;

providing a plurality of optical elements, each optical element of said plurality of optical elements comprising an optical element first surface, an optical element second surface, opposite said optical element first surface, and optical element sides;

forming a plurality of holes through said multi-package substrate, each hole of said plurality of holes extending from said multi-package substrate first surface to said multi-package substrate second surface, each hole of said plurality of holes comprising hole sides, each hole of said plurality of holes being large enough to position one of said second surfaces of said sensor dice in said hole;

applying tape to said second surface of said multi-package substrate, said tape covering each hole of said plurality of holes and thereby forming a hole bottom surface comprising a portion of said tape at the bottom of each hole;

positioning each sensor die of said plurality of sensor dice in a corresponding hole of said plurality of holes with said second surface of said sensor die on said corresponding hole bottom surface such that a distance between said second surfaces of said sensor dice and said second surface of said multi-package substrate is less than a distance between said first surface of said multi-package substrate and said second surface of said multi-package substrate;

positioning one optical element of said plurality of optical elements, one each, on a corresponding sensor die of said plurality of sensor dice such that said second surface of said optical element is positioned over said active region of said first surface of said corresponding sensor die;

electrically coupling said sensor dice to said multi-package substrate with electrical connections;

applying a layer of encapsulant to: a portion of said first surface of each sensor die not covered by said optical element; said first surface of said multi-package substrate; said electrical connections; and said optical element sides of each of said optical elements;

filling gaps between each sensor die of said plurality of sensor dice and said hole sides of said corresponding hole with said encapsulant;

allowing said encapsulant to harden;

removing said tape from said second surface of said substrate; and singulating packaged sensor dice from said multi-package substrate, wherein;

said optical elements are held in position over said active regions of said corresponding sensor dice first surfaces, at least in part, by said encapsulant applied to said optical element sides.

24. The method of claim 23, wherein;
said electrical connections comprise bond wires.

25. The method of claim 23, wherein;
A distance from said first surface of said optical element to said second surface of said substrate is in the range of 0.3 to 0.5 millimeters.

26. A method for packaging sensor dice comprising:

providing a multi-package substrate, said multi-package substrate comprising a multi-package substrate first surface and a multi-package substrate second surface, opposite said multi-package substrate first surface;

providing a plurality of sensor dice, each sensor die of said plurality of sensor dice comprising a sensor die first surface and a sensor die second surface, opposite said sensor die first surface, each sensor die of said plurality of sensor dice further comprising an active region on said first surface of said sensor die;

providing a plurality of optical elements, each optical element of said plurality of optical elements comprising an optical element first surface, an optical element second surface, opposite said optical element first surface, and optical element sides;

forming a plurality of holes through said multi-package substrate, each hole of said plurality of holes extending from said multi-package substrate first surface to said multi-package substrate second surface, each hole of said plurality of holes comprising hole sides, each hole of said plurality of holes being large enough to position one of said second surfaces of said sensor dice in said hole;

applying tape to said second surface of said multi-package substrate, said tape covering each hole of said plurality of holes and thereby forming a hole bottom surface comprising a portion of said tape at the bottom of each hole;

positioning each sensor die of said plurality of sensor dice in a corresponding hole of said plurality of holes with said second surface of said sensor die on said corresponding hole bottom surface such that a distance between said second surfaces of said sensor dice and said second surface of said multi-package substrate is less than a distance between said first surface of said multi-package substrate and said second surface of said multi-package substrate;

positioning one optical element of said plurality of optical elements, one each, on a corresponding sensor die of said plurality of sensor dice such that said second surface of said optical element is positioned over said active region of said first surface of said corresponding sensor die;

electrically coupling said sensor dice to said multi-package substrate with bond wires;

applying a layer of encapsulant to: a portion of said first surface of each sensor die not covered by said optical element; said first surface of said multi-package substrate; said bond wires; and said optical element sides of each of said optical elements;

filling gaps between each sensor die of said plurality of sensor dice and said hole sides of said corresponding hole with said encapsulant;

allowing said encapsulant to harden;

removing said tape from said second surface of said substrate; and singulating packaged sensor dice from said multi-package substrate, wherein;

said optical elements are held in position over said active regions of said corresponding sensor dice first surfaces, at least in part, by said encapsulant applied to said optical element sides, further wherein;

a distance from said first surfaces of said optical elements to said second surface of said multi-package substrate is in the range of 0.3 to 0.5 millimeters.

* * * * *